US012660711B2

(12) United States Patent
Kim et al.

(10) Patent No.: US 12,660,711 B2
(45) Date of Patent: Jun. 16, 2026

(54) CHIP STACK STRUCTURE AND SEMICONDUCTOR PACKAGE INCLUDING THE SAME

(71) Applicant: Samsung Electronics Co., Ltd., Suwon-si (KR)

(72) Inventors: Junhyoung Kim, Suwon-si (KR); Jiwon Kim, Suwon-si (KR); Minyong Lee, Suwon-si (KR); Dohyung Kim, Suwon-si (KR); Sukkang Sung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 375 days.

(21) Appl. No.: 18/346,921

(22) Filed: Jul. 5, 2023

(65) Prior Publication Data

US 2024/0203943 A1     Jun. 20, 2024

(30) Foreign Application Priority Data

Dec. 19, 2022     (KR) ........................ 10-2022-0178690

(51) Int. Cl.
H10W 90/00 (2026.01)
H10B 80/00 (2023.01)
(Continued)

(52) U.S. Cl.
CPC ............ H10W 90/00 (2026.01); H10B 80/00 (2023.02); H10W 20/43 (2026.01);
(Continued)

(58) Field of Classification Search
CPC ... H01L 25/0657; H01L 23/528; H01L 24/08; H01L 24/16; H01L 24/32; H01L 24/48;

H01L 24/73; H01L 2224/08145; H01L 2224/16145; H01L 2224/32145; H01L 2224/48227; H01L 2224/73215; H01L 2224/80379; H01L 2225/0651; H01L 2225/06562; H01L 24/05; H01L 24/20; H01L 2225/06541; H01L 2225/06565; H01L 24/06; H01L 25/18; H01L 2225/06527; H01L 23/4824; H01L 23/485; H01L 24/17; H01L 2224/02331; H01L 2224/02333; H01L 2224/02381; H01L 2224/16148; H01L 2224/1701; H01L 2224/17104; H01L 24/07; H01L 23/3171; H01L 2224/02371; H01L 2224/02373;
(Continued)

(56) References Cited

U.S. PATENT DOCUMENTS 10,074,667 B1 * 9/2018 Higashi ............... H01L 25/0657
10,763,242 B2 9/2020 Son et al.
(Continued)

OTHER PUBLICATIONS

Extended European Search Report for European Patent Application No. 23192801.1 issued on Feb. 8, 2024.

*Primary Examiner* — Mohammad M Hoque
(74) *Attorney, Agent, or Firm* — HARNESS, DICKEY & PIERCE, P.L.C.

(57) ABSTRACT

The inventive concept provides a chip stack structure including a first semiconductor chip and a second semiconductor chip bonded to each other, and a semiconductor package including a plurality of chip stack structures stacked in a vertical direction.

20 Claims, 18 Drawing Sheets

(51) Int. Cl.

| | |
|---|---|
| *H10W 20/43* | (2026.01) |
| *H10W 72/00* | (2026.01) |
| *H10W 72/90* | (2026.01) |
| *H10W 90/24* | (2026.01) |

(52) U.S. Cl.
CPC ........ *H10W 72/865* (2026.01); *H10W 72/951* (2026.01); *H10W 90/24* (2026.01); *H10W 90/722* (2026.01); *H10W 90/732* (2026.01); *H10W 90/754* (2026.01); *H10W 90/792* (2026.01)

(58) Field of Classification Search
CPC .......... H01L 2224/08123; H10B 80/00; H10B 43/27; H10W 90/00; H10W 20/43; H10W 72/865; H10W 72/951; H10W 90/24; H10W 90/722; H10W 90/732; H10W 90/754; H10W 90/792

USPC ........................................................ 257/668
See application file for complete search history.

(56) References Cited

U.S. PATENT DOCUMENTS

| | | | |
|---|---|---|---|
| 10,797,031 | B2 | 10/2020 | Liao et al. |
| 11,127,719 | B2 | 9/2021 | Greco et al. |
| 11,239,204 | B2 | 2/2022 | Wu et al. |
| 11,315,914 | B2 | 4/2022 | Sung et al. |
| 2012/0223241 | A1* | 9/2012 | Kim ...................... H10F 39/195 |
| | | | 250/394 |
| 2021/0104495 | A1* | 4/2021 | Vodrahalli ............. H01L 24/08 |
| 2022/0173060 | A1 | 6/2022 | Ahn et al. |
| 2022/0262695 | A1 | 8/2022 | Chang |
| 2022/0310545 | A1* | 9/2022 | Shih ...................... H01L 24/19 |

* cited by examiner

CHIP STACK STRUCTURE AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2022-0178690, filed on Dec. 19, 2022, in the Korean Intellectual Property Office, the disclosure of which is incorporated by reference herein in its entirety.

BACKGROUND

Inventive concepts as disclosed herein relate to chip stack structures and semiconductor packages including the chip stack structures.

In accordance with the rapid development of the electronics industry and the needs of users, electronic devices have become more compact, multifunctional, and have larger capacities. Accordingly, semiconductor packages including a plurality of semiconductor chips have been required, and recently, semiconductor packages having a three-dimensional (3D) stack structure in which a plurality of semiconductor chips are stacked in a vertical direction have been used.

SUMMARY

The inventive concepts provide chip stack structures including vertically stacked semiconductor chips.

The inventive concepts also provide semiconductor packages including a plurality of chip stack structures.

According to some example embodiments of the inventive concepts, there may be provided a chip stack structure including a first semiconductor chip including, a first semiconductor substrate, a first semiconductor device layer on the first semiconductor substrate, a first pad layer including a plurality of first pads arranged in a row in a first direction on the first semiconductor substrate and configured to receive different signals, such that the plurality of first pads are arranged in a first order in the first direction, a second pad layer including a plurality of second pads arranged in a row in the first direction on the first pad layer and configured to receive different signals, such that the plurality of second pads are arranged in a second order reverse to the first order in the first direction, and a redistribution layer including a plurality of redistribution patterns located between the first pad layer and the second pad layer, such that the plurality of redistribution patterns are configured to electrically connect a corresponding first pad, among the plurality of first pads, to a corresponding second pad, among the plurality of second pads; and a second semiconductor chip, on the first semiconductor chip, including a third pad layer including a plurality of third pads arranged in a row in the first direction on the second pad layer and configured to receive different signals, such that each of the plurality of third pads is bonded to a corresponding second pad, among the plurality of second pads, and a second semiconductor device layer on the third pad layer.

According to some example embodiments of the inventive concepts, there may be provided a semiconductor package including a package substrate; and a plurality of chip stack structures mutually stacked in a vertical direction on the package substrate, wherein each of the plurality of chip stack structures includes a first semiconductor chip and a second semiconductor chip on the first semiconductor chip, wherein the first semiconductor chip includes, a first semiconductor substrate, a first semiconductor device layer on the first semiconductor substrate, a first pad layer including a plurality of first pads arranged in a row in a first direction on the first semiconductor substrate and configured to receive different signals, such that the plurality of first pads are arranged in a first order in the first direction, a second pad layer including a plurality of second pads arranged in a row in the first direction on the first pad layer and configured to receive different signals, such that the plurality of second pads are arranged in a second order reverse to the first order in the first direction, and a redistribution layer including a plurality of redistribution patterns located between the first pad layer and the second pad layer, such that the plurality of redistribution patterns are configured to electrically connect a corresponding first pad, among the plurality of first pads, to a corresponding second pad, among the plurality of second pads; and wherein the second semiconductor chip includes, a third pad layer including a plurality of third pads arranged in a row in the first direction on the second pad layer and configured to receive different signals, such that each of the plurality of third pads is bonded to a corresponding second pad, among the plurality of second pads, and a second semiconductor device layer on the third pad layer.

According to some example embodiments of the inventive concepts, there may be provided a chip stack structure including a first semiconductor chip including, a first semiconductor substrate, a first semiconductor device layer on the first semiconductor substrate, a first pad layer including a plurality of first pads arranged in a row in a first direction on the first semiconductor substrate and a first pad insulating layer surrounding the plurality of first pads, such that the plurality of first pads are arranged in a first order in the first direction, a second pad layer including a plurality of second pads arranged in a row in the first direction on the first pad layer and a second pad insulating layer surrounding the plurality of second pads, such that the plurality of second pads are arranged in a second order reverse to the first order in the first direction, and a redistribution layer including a plurality of redistribution patterns located between the first pad layer and the second pad layer, such that the plurality of redistribution patterns are configured to electrically connect a corresponding first pad, among the plurality of first pads, to a corresponding second pad, among the plurality of second pads; and a second semiconductor chip, on the first semiconductor chip including, a third pad layer including a plurality of third pads arranged in a row in the first direction on the second pad layer and a third pad insulating layer surrounding the plurality of third pads, such that each of the plurality of third pads is bonded to a corresponding second pad, among the plurality of second pads, a second semiconductor device layer on the third pad layer, external connection pads on the second semiconductor chip, and a passivation layer disposed on the second semiconductor chip and having openings exposing the external connection pads, wherein, the plurality of first pads include M pads (M is a natural number) arranged in the first direction, the plurality of second pads include M pads arranged in the first direction, the plurality of third pads include M pads in the first direction, an N-th pad (N is a natural number less than or equal to M) in the first direction, among the plurality of second pads, is configured to electrically connect to an $(M+1-N)$-th pad in the first direction, among the plurality of first pads, through the plurality of redistribution patterns, and the N-th pad in the first direction, among the plurality of second pads, is bonded to an N-th pad in the first direction, among the plurality of third pads.

BRIEF DESCRIPTION OF THE DRAWINGS

Example embodiments will be more clearly understood from the following detailed description taken in conjunction with the accompanying drawings in which.

DETAILED DESCRIPTION

Figure 1:
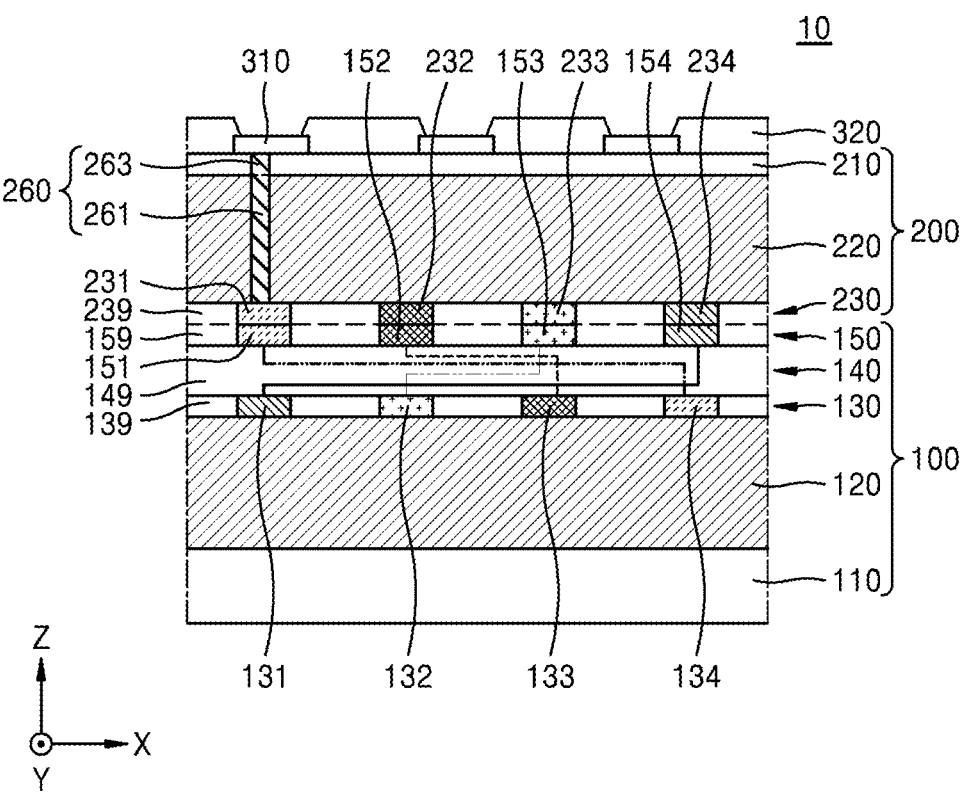
FIG. 1 is a cross-sectional view illustrating a chip stack structure according to example embodiments.

Hereinafter, example embodiments are described in detail with reference to the accompanying drawings. The same reference numerals are used for the same components in the drawings, and redundant descriptions thereof are omitted.

In this specification, a vertical direction may be defined as a Z direction, and a horizontal direction may be defined as a direction perpendicular to the Z direction. A first horizontal direction and a second horizontal direction may be defined as directions crossing each other. The first horizontal direction may be referred to as an X direction, and a second horizontal direction may be referred to as a Y direction. A vertical level may refer to a height level in the vertical direction, a horizontal width of a component may refer to a length of the component in the horizontal direction, a thickness of the component may refer to a length of the component in the vertical direction, and a planar area of the component may refer to an area occupied by the component on a plane (i.e., an X-Y plane) parallel to the X and Y directions. A pitch distance may refer to a length between centers of two adjacent components, among components having a regular arrangement, in the horizontal direction.

FIG. 1 is a cross-sectional view illustrating a chip stack structure 10 according to some example embodiments. FIG.

2 is a configuration diagram illustrating some components of the chip stack structure 10 according to some example embodiments.

Figure 2:
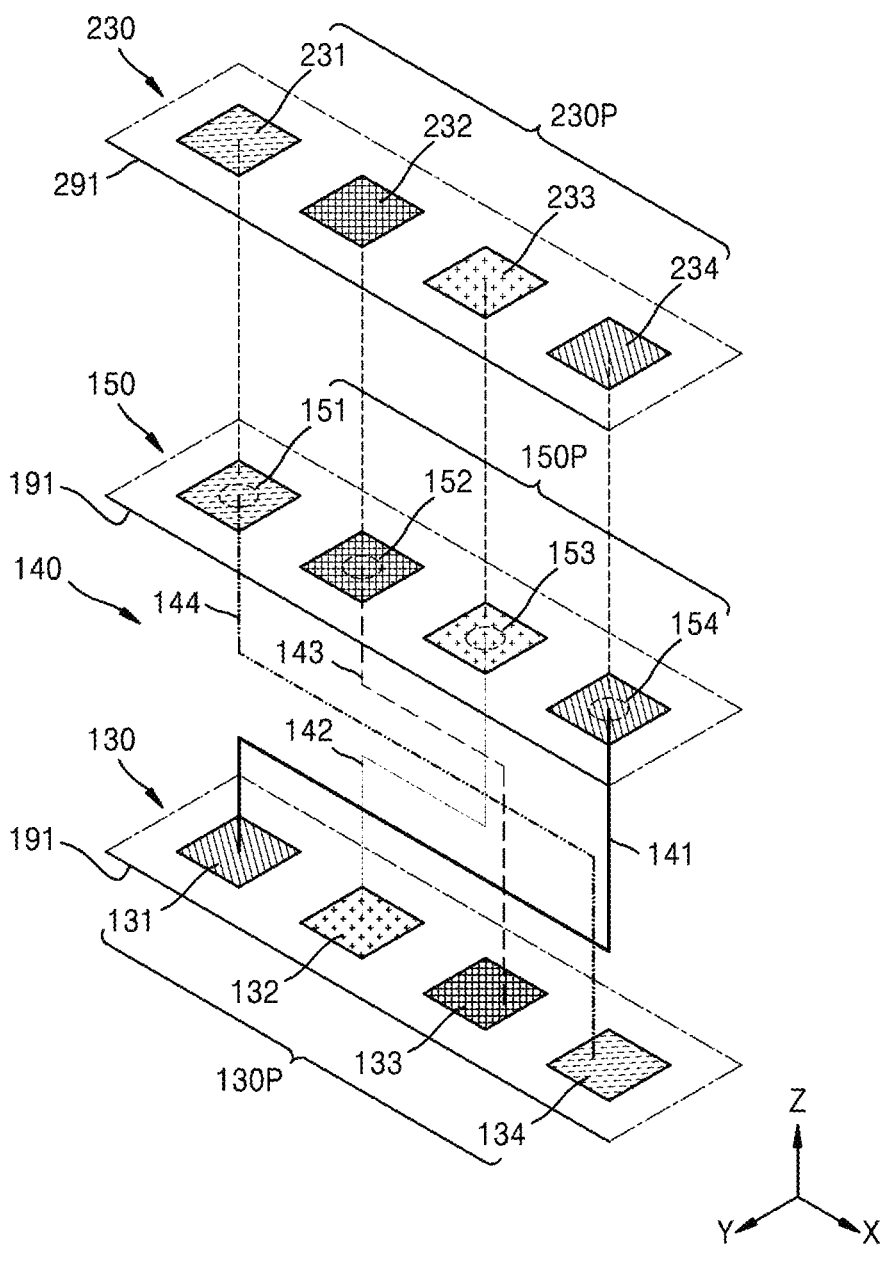
FIG. 2 is a configuration diagram illustrating some components of a chip stack structure according to example embodiments.

Referring to FIGS. 1 and 2, a chip stack structure 10 according to some example embodiments may include a first semiconductor chip 100 and a second semiconductor chip 200 stacked on the first semiconductor chip 100.

In some example embodiments, the first semiconductor chip 100 may be bonded to the second semiconductor chip 200 to function as a single device. The first semiconductor chip 100 may be bonded to the second semiconductor chip 200 using a metal-to-metal bonding method or a hybrid direct bonding method. In some example embodiments, the first semiconductor chip 100 may be bonded to the second semiconductor chip 200 using a face-to-face bonding method. In some example embodiments, the first semiconductor chip 100 and the second semiconductor chip 200 may have the same horizontal width, and a sidewall of the first semiconductor chip 100 may be aligned with a sidewall of the second semiconductor chip 200 in the chip stack structure 10 in the vertical direction (the Z direction).

In some example embodiments, the first semiconductor chip 100 and the second semiconductor chip 200 included in the chip stack structure 10 may be the same type of semiconductor chips. For example, the first semiconductor chip 100 and the second semiconductor chip 200 may be memory chips. The memory chips may be, for example, volatile memory semiconductor chips, such as dynamic random access memory (DRAM) and/or a static random access memory (SRAM). Additionally, the memory chips may be non-volatile memory semiconductor chips, such as phase-change random access memory (PRAM), magnetoresistive random access memory (MRAM), ferroelectric random access memory (FeRAM), and/or resistive random access memory (RRAM).

In some example embodiments, the first semiconductor chip 100 and the second semiconductor chip 200 included in the chip stack structure 10 may include different types of semiconductor chips. For example, one of the first semiconductor chip 100 and the second semiconductor chip 200 may be a logic chip, and the other of the first semiconductor chip 100 and the second semiconductor chip 200 may be a memory chip. For example, the logic chip may be a central processing unit (CPU) chip, a graphics processing unit (GPU) chip, and/or an application processor (AP) chip.

In some example embodiments, the first semiconductor chip 100 and/or the second semiconductor chip 200 may be flash memory chips, such as NAND flash memory chips.

Example embodiments of the first semiconductor chip 100 may include a first semiconductor substrate 110, a first semiconductor device layer 120, a first pad layer 130, a redistribution layer 140, and a second pad layer 150.

Example embodiments of the first semiconductor substrate 110 may be a bulk wafer or a wafer including epitaxial growth. The first semiconductor substrate 110 may include a group IV semiconductor material, a group III-V semiconductor material, and/or a group II-VI semiconductor material. The group IV semiconductor material may include, for example, silicon (Si), germanium (Ge), or silicon germanium (SiGe). The group III-V semiconductor material may include, for example, gallium arsenide (GaAs), indium phosphide (InP), gallium phosphide (GaP), indium arsenide (InAs), indium antimony (InSb), or indium gallium arsenide (InGaAs). The group II-VI semiconductor material may include, for example, zinc telluride (ZnTe), or cadmium sulfide (CdS). The first semiconductor substrate 110 may include a conductive region, for example, a region well doped with impurities, or a structure doped with impurities. Also, the first semiconductor substrate 110 may have various device isolation structures, such as a shallow trench isolation (STI) structure. The first semiconductor substrate 110 may have upper and lower surfaces opposite to each other. The upper surface of the first semiconductor substrate 110 may be an active surface of the first semiconductor substrate 110, and the lower surface of the first semiconductor substrate 110 may be an inactive surface of the first semiconductor substrate 110.

The first semiconductor device layer 120 may be disposed on the first semiconductor substrate 110. Example embodiments of the first semiconductor device layer 120 may include a front end of line (FEOL) structure formed on the upper surface of the first semiconductor substrate 110 and a back end of line (BEOL) structure formed on the FEOL structure. The FEOL structure may include first discrete devices formed within the first semiconductor substrate 110 and/or on the active surface of the first semiconductor substrate 110. The first discrete devices may include micro-electronic devices, for example, image sensors, such as metal-oxide-semiconductor field effect transistors (MOS-FETs), large scale integration (LSI), complementary metal-oxide-semiconductor (CMOS) imaging sensors (CISs), micro-electro-mechanical systems (MEMSs), active devices, passive devices, and the like. The BEOL structure may include an interconnect layer having a multilayer structure.

The first pad layer 130 may be disposed on the first semiconductor device layer 120. The first pad layer 130 may include a first pad insulating layer 139 and a plurality of first conductive pads 130P surrounded by the first pad insulating layer 139.

The first pad insulating layer 139 may include oxide and/or nitride. For example, the first pad insulating layer 139 may include at least one of SiO, SiN, SiCN, SiCO, and/or a polymer material. For example, the polymer material may be benzocyclobutene (BCB), polyimide (PI), polybenzoxazole (PBO), silicone, or epoxy.

According to some example embodiments, the first conductive pads 130P may be at substantially the same vertical level. The first conductive pads 130P may have the same dimensions as each other. For example, in the first conductive pads 130P, a horizontal width in the first horizontal direction (the X direction) and a horizontal width in the second horizontal direction (the Y direction) may be constant. The first conductive pads 130P may be arranged in a row in the first horizontal direction (the X direction), and the first conductive pads 130P may be arranged to have a first pitch distance in the first horizontal direction (the X direction). In some example embodiments, when the first semiconductor chip 100 has a first sidewall 191 parallel to the first horizontal direction (the X direction), the first conductive pads 130P may be arranged in a row in the first horizontal direction (the X direction), and a distance between each of the first conductive pads 130P and the first sidewall 191 of the first semiconductor chip 100 in the second horizontal direction (the Y direction) may be uniform. The first conductive pads 130P may include a metal material, such as copper (Cu), aluminum (Al), tungsten (W), silver (Ag), or gold (Au).

Example embodiments of the first conductive pads 130P may include different types of pads. In other words, the first conductive pads 130P may be configured to receive different signals and may constitute transmission paths of different electrical signals within the first semiconductor chip 100. The first conductive pads 130P may include input/output (I/O) signal pads configured to transfer I/O signals (I/O data signals, control signals, etc.) and power terminals supplying power to devices of the first semiconductor chip 100. In some example embodiments, the first conductive pads 130P may include an I/O pad to which a data I/O signal is transmitted, a data strobe signal (DQS) pad to which a DQS is transmitted, a chip enable (CE) pad to which a CE signal is transmitted, a read enable (RE) pad to which an RE signal is transmitted, a write enable (WE) pad to which a WE signal is transmitted, a command latch enable (CLE) pad to which a CLE signal is transmitted, an address latch enable (ALE) pad to which an ALE signal is transmitted, a ready/busy (R/B) pad to which an R/B signal is transmitted, a power pad to which a power signal (e.g., a positive supply voltage) is transmitted, a ground pad to which a ground signal (e.g., a ground voltage) is transmitted, or a combination thereof.

The redistribution layer 140 may be located between the first pad layer 130 and the second pad layer 150. Example embodiments of the redistribution layer 140 may include a redistribution insulating layer 149 and a plurality of conductive redistribution patterns 141, 142, 143, and 144 extending within the redistribution insulating layer 149. For example, the redistribution insulating layer 149 may include photosensitive polyimide (PSPI). Each of the redistribution patterns 141, 142, 143, and 144 may include a plurality of conductive lines located at different vertical levels within the redistribution insulating layer 149 and a redistribution via extending in the vertical direction (the Z direction) within the redistribution insulating layer 149 and electrically connecting the conductive lines located at different vertical levels to each other. The redistribution patterns 141, 142, 143, and 144 may include a metal material, such as copper (Cu), aluminum (Al), tungsten (W), silver (Ag), or gold (Au).

The second pad layer 150 may be disposed on the redistribution layer 140. The second pad layer 150 may include a second pad insulating layer 159 and a plurality of second conductive pads 150P surrounded by the second pad insulating layer 159.

The second pad insulating layer 159 may include oxide and/or nitride. For example, the second pad insulating layer 159 may include at least one of SiO, SiN, SiCN, SiCO, and/or a polymer material. For example, the polymer material may be BCB, PI, PBO, silicone, or epoxy. An upper surface of the second pad insulating layer 159 may constitute an upper surface of the first semiconductor chip 100.

Example embodiments of the second conductive pads 150P may be located at substantially the same vertical level. Upper surfaces of the second conductive pads 150P may constitute the upper surface of the first semiconductor chip 100. The second conductive pads 150P may have the same dimensions as each other. For example, in the second conductive pads 150P, a horizontal width in the first horizontal direction (the X direction) and a horizontal width in the second horizontal direction (the Y direction) may be constant. Each of the second conductive pads 150P may have the same dimensions as those of each of the first conductive pads 130P. The second conductive pads 150P may be arranged in a row in the first horizontal direction (the X direction), and the second conductive pads 150P may be arranged to have a first pitch distance in the first horizontal direction (the X direction). The first pitch distance of the pad arrangement of the second conductive pads 150P may be the same as the first pitch distance of the pad arrangement of the first conductive pads 130P. In some example embodiments, when the first semiconductor chip 100 has the first sidewall 191 parallel to the first horizontal direction (the X direction), the second conductive pads 150P may be arranged in a row in the first horizontal direction (the X direction), and a distance between each of the second conductive pads 150P and the first sidewall 191 of the first semiconductor chip 100 in the second horizontal direction (the Y direction) may be uniform. The second conductive pads 150P may include a metal material, such as copper (Cu), aluminum (Al), tungsten (W), silver (Ag), or gold (Au).

Example embodiments of the second conductive pads 150P may include different types of pads. In other words, the second conductive pads 150P may be configured to receive different signals and may constitute transmission paths of different electrical signals within the first semiconductor chip 100. The second conductive pads 150P may include I/O signal pads configured to transfer I/O signals (I/O data signals, control signals, etc.) and power terminals supplying power to elements of the second semiconductor chip 200. In some example embodiments, the second conductive pads 150P may include an I/O pad, a DQS pad, a CE pad, an RE pad, a WE pad, a CLE pad, an ALE pad, an R/B pad, a power pad, a ground pad, or a combination thereof.

The second conductive pads 150P may be electrically connected to the first conductive pads 130P through the redistribution patterns 141, 142, 143, and 144. Each of the redistribution patterns 141, 142, 143, and 144 may electrically connect one pad selected from among the second conductive pads 150P to one pad selected from among the first conductive pads 130P. The second conductive pads 150P and the first conductive pads 130P electrically connected to each other through individual redistribution patterns 141, 142, 143, and 144 may be configured to transmit the same signal.

Example embodiments of the second semiconductor chip 200 may include a second semiconductor substrate 210, a second semiconductor device layer 220, and a third pad layer 230. In the second semiconductor chip 200, the second semiconductor device layer 220 may be below the second semiconductor substrate 210, and the third pad layer 230 may be below the second semiconductor device layer 220.

The second semiconductor substrate 210 may have upper and lower surfaces opposite to each other. The lower surface of the second semiconductor substrate 210 may be an active surface of the second semiconductor substrate 210, and the upper surface of the second semiconductor substrate 210 may be an inactive surface of the second semiconductor substrate 210. A material of the second semiconductor substrate 210 may be the same as that of the first semiconductor substrate 110. The second semiconductor substrate 210 may include a conductive region, for example, a well doped region with impurities. The conductive region may include various device isolation structures, such as a structure doped with impurities and/or an STI structure.

Example embodiments of the second semiconductor device layer 220 may include an FEOL structure formed on the lower surface of the second semiconductor substrate 210 and a BEOL structure formed below the FEOL structure. The FEOL structure of the second semiconductor device layer 220 may include second discrete devices formed within the second semiconductor substrate 210 and/or on the active surface of the second semiconductor substrate 210. The second discrete devices may include microelectronic devices, for example, image sensors, such as MOSFETs, system LSIs, CISs, MEMSs, active devices, passive devices, and the like. The BEOL structure may include an interconnect layer having a multilayer structure.

The third pad layer 230 may be directly connected to the second pad layer 150 of the first semiconductor chip 100.

That is, the third pad layer 230 may be bonded to the second pad layer 150. The third pad layer 230 may include a third pad insulating layer 239 and a plurality of third conductive pads 230P surrounded by the third pad insulating layer 239.

The third pad insulating layer 239 may include oxide and/or nitride. For example, the third pad insulating layer 239 may include at least one of SiO, SiN, SiCN, SiCO, and/or a polymer material. For example, the polymer material may be BCB, PI, PBO, silicone, or epoxy. A lower surface of the third pad insulating layer 239 may constitute a lower surface of the second semiconductor chip 200.

Example embodiments of the third conductive pads 230P may be located at substantially the same vertical level. A lower surface of each of the third conductive pads 230P may constitute the lower surface of the second semiconductor chip 200. The third conductive pads 230P may have the same dimensions as each other. For example, in the third conductive pads 230P, a horizontal width in the first horizontal direction (the X direction) and a horizontal width in the second horizontal direction (the Y direction) may be constant. Each of the third conductive pads 230P may have the same dimensions as those of each of the second conductive pads 150P. The third conductive pads 230P may be arranged in a row in the first horizontal direction (the X direction), and the third conductive pads 230P may be arranged to have a first pitch distance in the first horizontal direction (the X direction). The first pitch distance of the pad arrangement of the third conductive pads 230P may be the same as the first pitch distance of the pad arrangement of the second conductive pads 150P. In some example embodiments, when a second sidewall 291 of the second semiconductor chip 200 is parallel to the first horizontal direction (the X direction) and vertically aligned with the first sidewall 191 of the first semiconductor chip 100, the third conductive pads 230P may be arranged in a row in the first horizontal direction (the X direction) and a distance between each of the third conductive pads 230P and the second sidewall 291 of the second semiconductor chip 200 in the second horizontal direction (the Y direction) may be uniform. The third conductive pads 230P may include a metal material, such as copper (Cu), aluminum (Al), tungsten (W), silver (Ag), or gold (Au).

The third conductive pads 230P may include different types of pads. In other words, the third conductive pads 230P may be configured to receive different signals and may constitute transmission paths of different electrical signals within the second semiconductor chip 200. The third conductive pads 230P include I/O signal pads configured to transfer I/O signals (I/O data signals, control signals, etc.) and/or power terminals supplying power to devices of the second semiconductor chip 200. In some example embodiments, the third conductive pads 230P may include an I/O pad, a DQS pad, a CE pad, an RE pad, a WE pad, a CLE pad, an ALE pad, an R/B pad, a power pad, a ground pad, or a combination thereof.

The first semiconductor chip 100 may be bonded to the second semiconductor chip 200 through hybrid direct bonding. The upper surface of the second pad insulating layer 159 may be bonded to the lower surface of the third pad insulating layer 239, and the upper surfaces of the second conductive pads 150P may be bonded to the lower surfaces of the third conductive pads 230P. In some example embodiments, a material of the second pad insulating layer 159 may be the same as that of the third pad insulating layer 239. For example, the second pad insulating layer 159 and the third pad insulating layer 239 may include silicon oxide. For bonding of the first semiconductor chip 100 to the second semiconductor chip 200, the upper surface of the second pad insulating layer 159 and the lower surface of the third pad insulating layer 239 may be subjected to a plasma treatment and/or wet treatment to have bonding strength suitable for bonding. The second conductive pads 150P and the third conductive pads 230P may include the same metal as each other, for example, copper.

According to some example embodiments, the pad arrangement of the second conductive pads 150P may be the same as that of the third conductive pads 230P. The fact that the pad arrangements are the same may be understood as that an arrangement order of the pads included in the pad layers, dimensions of the pads, and pitch distances are the same.

According to some example embodiments, the pad arrangement of the second conductive pads 150P may be the same as the pad arrangement of the third conductive pads 230P. The second conductive pads 150P and the third conductive pads 230P may be arranged in a first arrangement order in the horizontal direction (the X direction). When the second conductive pads 150P and the third conductive pads 230P each include M (M is a natural number) pads arranged in the first horizontal direction (the X direction), a second conductive pad of the second conductive pads 150P may be in an N-th order (N is a natural number equal to or smaller than M) in the first horizontal direction (the X direction) in the pad arrangement of the second conductive pads 150P. A third conductive pad of the third conductive pads 230P may be in the N-th order in the first horizontal direction (the X direction) in the pad arrangement of the third conductive pads 230P. The second conductive pad in the N-th order of the second conductive pads 150P may be the same type of pad configured to transmit the same signal as the third conductive pad in the N-th order of the third conductive pads 230P.

For example, the second conductive pads 150P may include a (2-1)-th conductive pad 151, a (2-2)-th conductive pad 152, and a (2-3)-th conductive pad 153, and a (2-4)-th conductive pad 154 sequentially arranged in the first horizontal direction (the X direction), and the third conductive pads 230P may include a (3-1)-th conductive pad 231, a (3-2)-th conductive pad 232, a (3-3)-th conductive pad 233, and a (3-4)-th conductive pad 234 sequentially arranged in the first horizontal direction (the X direction). Here, the (2-1)-th conductive pad 151 and the (3-1)-th conductive pad 231 bonded to each other may be the same type of pads configured to transmit the same signal to each other, the (2-2)-th conductive pad 152 and the (3-2)-th conductive pad 232 may be the same type of pads configured to transmit the same signal to each other, the (2-3)-th conductive pad 153 and the (3-3)-th conductive pad 233 bonded to each other may be the same type of pads configured to transmit the same signal to each other, and the (2-4)-th conductive pad 154 and the (3-4)-th conductive pad 234 bonded to each other may be the same type of pads configured to transmit the same signal to each other.

The arrangement order of the first conductive pads 130P may be opposite to the arrangement order of the second conductive pads 150P. That is, when the second conductive pads 150P are arranged in the first arrangement order in the first horizontal direction (the X direction), the first conductive pads 130P may be arranged in a second arrangement order reverse to the first arrangement order in the first horizontal direction (the X direction). When the first conductive pads 130P and the second conductive pads 150P each include M (M is a natural number) pads arranged in the first horizontal direction (the X direction), a second conductive pad of the second conductive pads 150P may be in an N-th order in the first horizontal direction (the X direction) in the pad arrangement of the second conductive pads 150P. Additionally, a first conductive pad of the first conductive pads 130P, may be in an (M+1−N)-th order in the first horizontal direction (the X direction) in the pad arrangement of the first conductive pads 130P. The second conductive pad in the N-th order of the second conductive pads 150P may be the same type of pad configured to transmit the same signal as the first conductive pad in the (M+1−N)-th order of the first conductive pads 130P.

For example, the second conductive pads 150P may include a (2-1)-th conductive pad 151, a (2-2)-th conductive pad 152, a (2-3)-th conductive pad 153, and a (2-4)-th conductive pad 154 sequentially arranged in the first horizontal direction (the X direction). The first conductive pads 130P may include a (1-1)-th conductive pad 131, a (1-2)-th conductive pad 132, a (1-3)-th conductive pad 133, and a (1-4)-th conductive pad 134 sequentially arranged in the first horizontal direction (the X direction). According to some example embodiments, the (2-1)-th conductive pad 151 and the (1-4)-th conductive pad 134 may be the same type of pads configured to transmit the same signal to each other, the (2-2)-th conductive pad 152 and the (1-3)-th conductive pad 133 may be the same type of pads configured to transmit the same signal to each other, the (2-3)-th conductive pad 153 and the (1-2)-th conductive pads 132 may be the same type of pads configured to transmit the same signal to each other, and the (2-4)-th conductive pad 154 and the (1-1)-th conductive pad 131 may be the same type of pads configured to transmit the same signal to each other.

In the first conductive pads 130P and the second conductive pads 150P, the first conductive pads 130P and the second conductive pads 150P may be electrically connected to each other through redistribution patterns 141, 142, 143, and 144 to transmit the same signal and may not overlap in the vertical direction (the Z direction). In other words, in a plan view, a first conductive pad of the first conductive pads 130P and a second conductive pad of the second conductive pads 150P may be electrically connected through the redistribution patterns 141, 142, 143, and 144, configured to transmit the same signal, and spaced apart from each other in a horizontal direction (the X direction). For example, the (2-1)-th conductive pad 151 and the (1-4)-th conductive pad 134 may be configured to transmit the same signal to each other, and the (2-1)-th conductive pad 151 and the (1-4)-th conductive pad 134 may not overlap each other in the vertical direction (the Z direction). In the first conductive pads 130P and the second conductive pads 150P, the first conductive pads 130P and the second conductive pads 150P, which vertically overlap each other, may not be electrically connected to each other. For example, the (1-1)-th conductive pad 131 and the (2-1)-th conductive pad 151 may vertically overlap but not be electrically connected to each other.

Example embodiments of the chip stack structure 10 may further include a plurality of external connection pads 310 disposed on the second semiconductor substrate 210 of the second semiconductor chip 200 and a passivation layer 320 disposed on the second semiconductor substrate 210 of the second semiconductor chip 200 and partially covering each of the external connection pads 310. The passivation layer 320 may include a plurality of openings exposing the external connection pads 310 to the outside of the chip stack structure 10. The passivation layer 320 may include, for example, PSPI. The external connection pads 310 may be I/O pads to which connection members electrically connecting the chip stack structure 10 to another substrate are connected. The external connection pads 310 may include a metal material, such as copper (Cu), aluminum (Al), tungsten (W), silver (Ag), or gold (Au). In addition, the second semiconductor chip 200 may further include at least one vertical connection conductor 260 extending between at least one of the external connection pads 310 and at least one of the third conductive pads 230P. Each vertical connection conductor 260 may include an upper conductor 263 passing through the second semiconductor substrate 210 and a lower conductor 261 provided in the second semiconductor device layer 220.

FIGS. 3A to 3E are cross-sectional views illustrating a manufacturing method of the chip stack structure 10 according to some example embodiments. Hereinafter, the manufacturing method of the chip stack structure 10 described above with reference to FIGS. 1 and 2 is described with reference to FIGS. 3A to 3E.

Figure 3A:
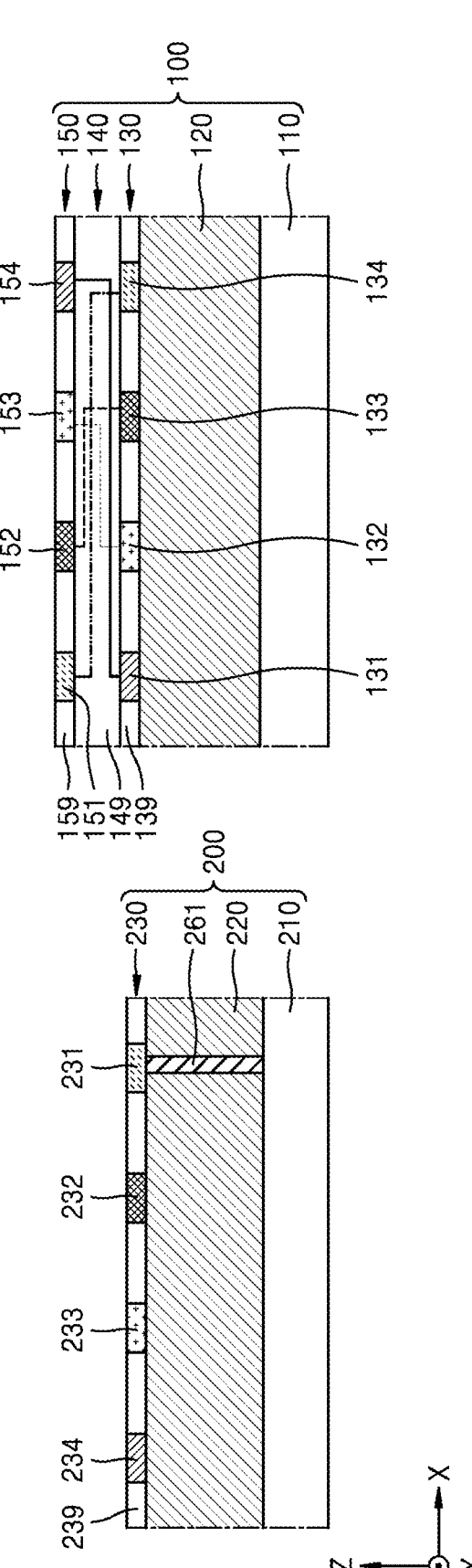
FIGS. 3A to 3E are cross-sectional views illustrating a manufacturing method of a chip stack structure according to example embodiments.

Referring to FIG. 3A, the first semiconductor chip 100 and the second semiconductor chip 200 are prepared according to some example embodiments.

Preparing the first semiconductor chip 100 may include forming the first semiconductor device layer 120 on the first semiconductor substrate 110, forming the first pad layer 130 on the first semiconductor device layer 120, forming the first redistribution layer 140 on the first pad layer 130, and forming the second pad layer 150 on the first redistribution layer 140. In the forming of the second pad layer 150, the arrangement order of the second conductive pads 150P may be opposite to that of the first conductive pads 130P.

Preparing the second semiconductor chip 200 may include forming the second semiconductor device layer 220 on the second semiconductor substrate 210 and forming the third pad layer 230 on the second semiconductor device layer 220. The forming of the third pad layer 230 may be substantially the same as the forming of the first pad layer 130 of the first semiconductor chip 100, and a layout of the first pad layer 130 may be substantially the same as a layout of the third pad layer 230. When the active surface of the first semiconductor substrate 110 and the active surface of the second semiconductor substrate 210 face in the same direction (e.g., a +Z direction), the pad arrangement of the first conductive pads 130P may be the same as the pad arrangement of the third conductive pads 230P.

Figure 3B:
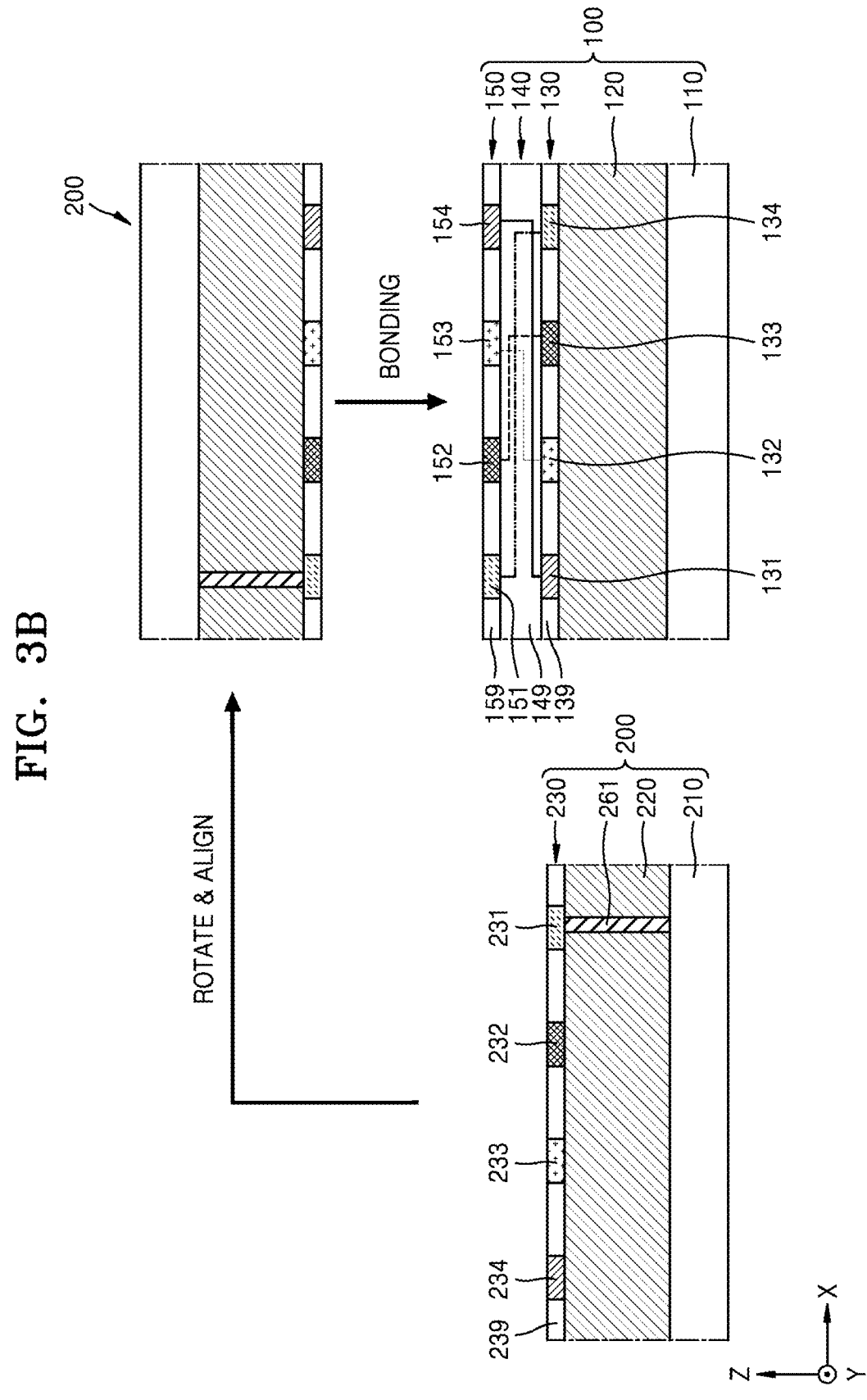

Referring to FIG. 3B, after preparing the first semiconductor chip 100 and the second semiconductor chip 200, an operation of rotating the second semiconductor chip 200 such that the top and bottom of the second semiconductor chip 200 is reversed and an operation of vertically aligning the second semiconductor chip 200 with the first semiconductor chip 100 may be performed according to some example embodiments. When the operation of rotating the second semiconductor chip 200 so that the top and bottom of the second semiconductor chip 200 are reversed and the operation of vertically aligning the second semiconductor chip 200 with the first semiconductor chip 100 are completed, the third pad layer 230 of the second semiconductor chip 200 may face the second pad layer 150 of the first semiconductor chip 100. In the operation of rotating the second semiconductor chip 200 so that the top and bottom of the second semiconductor chip 200 is reversed, the second semiconductor chip 200 may be rotated by 180 degrees with respect to the second horizontal direction (the Y direction), and a direction (e.g., −Z direction) in which the active surface of the second semiconductor substrate 210 faces may be opposite to a direction (e.g., the +Z direction) in which the active surface of the first semiconductor substrate 110 faces. The arrangement order of the third conductive pads 230P after rotation of the second semiconductor chip 200 may be opposite to the arrangement order of the third conductive pads 230P before rotation of the second semiconductor chip 200. In a state in which the third pad layer 230 of the second semiconductor chip 200 faces the second pad layer 150 of the first semiconductor chip 100, the arrangement order of the third conductive pads 230P may be the same as the arrangement order of the second conductive pads 150P.

Figure 3C:
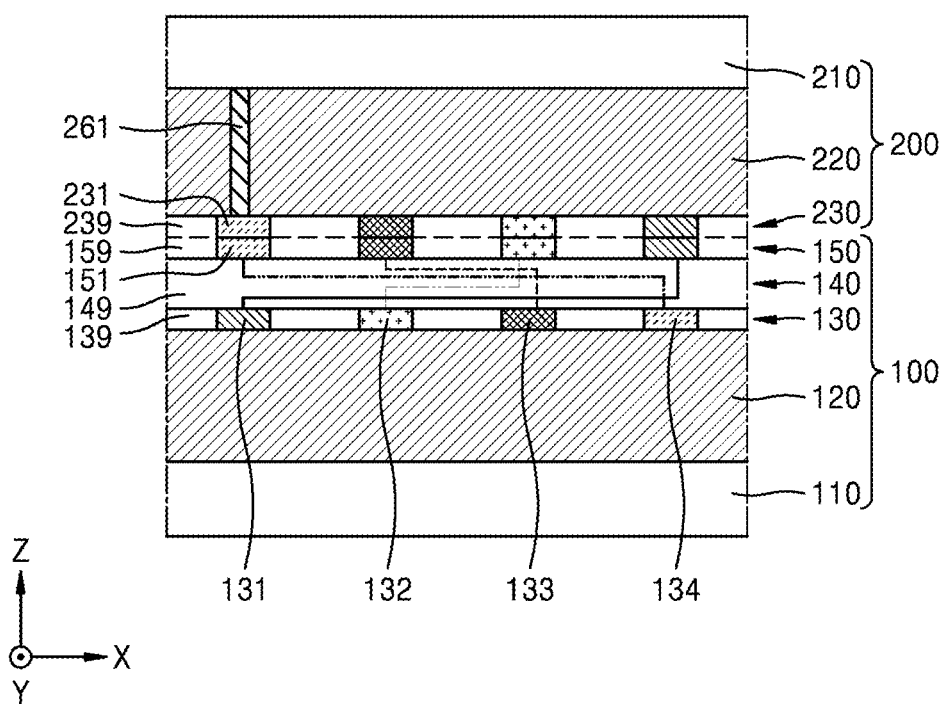

Referring to FIGS. 3B and 3C, after the second semiconductor chip 200 and the first semiconductor chip 100 are vertically aligned with one another, the second semiconductor chip 200 may be bonded to the first semiconductor chip 100 according to some example embodiments. After bringing a bonding surface of the second pad layer 150 (i.e., an upper surface of the second pad layer 150) into contact with a bonding surface of the third pad layer 230 (a lower surface of the third pad layer 230), the second semiconductor chip 200 may be bonded to the first semiconductor chip 100 by applying heat to a bonding interface between the first semiconductor chip 100 and the second semiconductor chip 200.

Figure 3D:
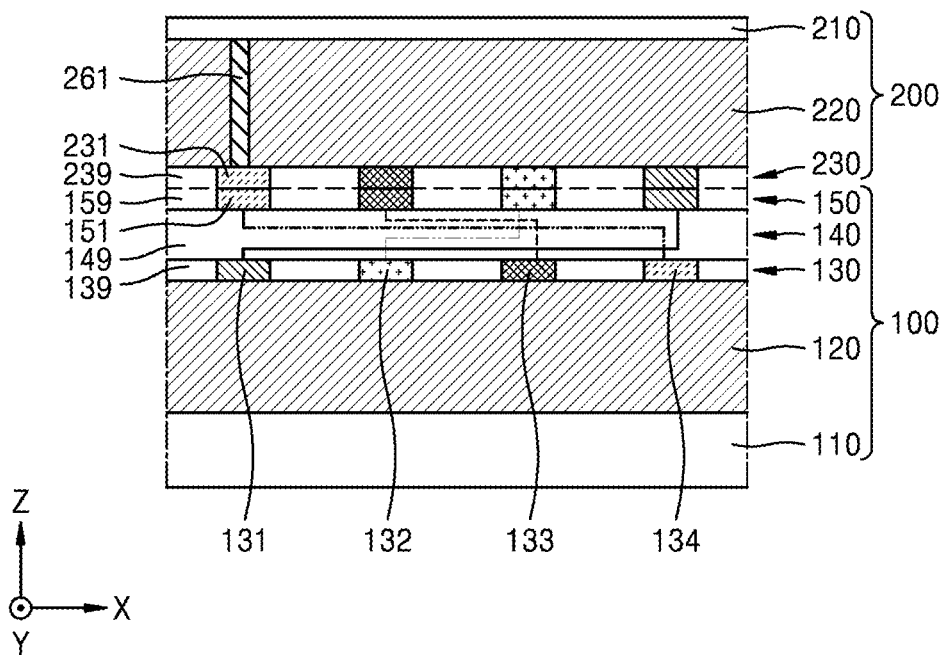

Referring to FIGS. 3C and 3D, a portion of the second semiconductor substrate 210 may be removed to reduce a thickness of the second semiconductor substrate 210 of the second semiconductor chip 200 according to some example embodiments. A polishing process may be performed on the second semiconductor substrate 210 to remove a portion of the second semiconductor substrate 210. By the polishing process on the second semiconductor substrate 210, the thickness of the second semiconductor substrate 210 may be less than that of the first semiconductor substrate 110. For example, as a result of the polishing process, the thickness of the second semiconductor substrate 210 may be between about 10 μm and about 30 μm.

Figure 3E:
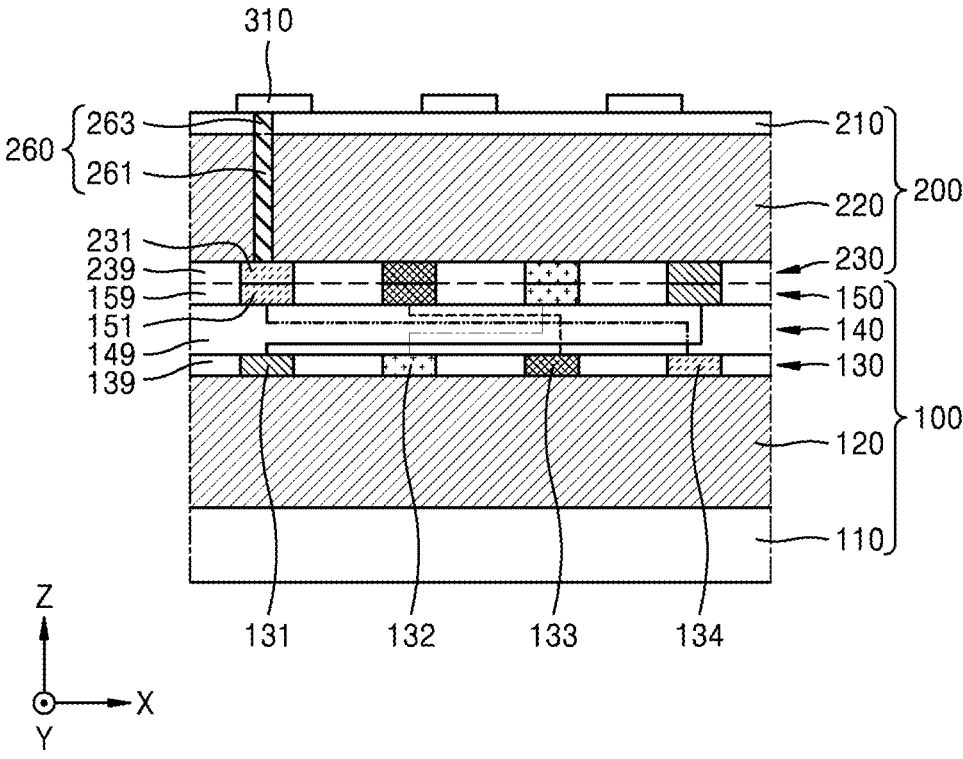

Referring to FIG. 3E, the upper conductor 263 passing through the second semiconductor substrate 210 may be formed according to some example embodiments. The upper conductor 263 may be, for example, a through-electrode passing through the second semiconductor substrate 210. The upper conductor 263 may be connected to the lower conductor 261 provided on the second semiconductor device layer 220, and the lower conductor 261 and the upper conductor 263 may constitute the vertical connection conductor 260. Thereafter, the external connection pads 310 are formed on the second semiconductor substrate 210. At least one of the external connection pads 310 may be electrically connected to the third conductive pad 230P through the vertical connection conductor 260.

Next, referring to FIG. 1, after forming the external connection pads 310, the passivation layer 320 partially covering each of the external connection pads 310 may be formed on the second semiconductor substrate 210 of the second semiconductor chip 200 according to some example embodiments. The passivation layer 320 may include a plurality of openings exposing the external connection pads 310 to the outside.

Figure 4:
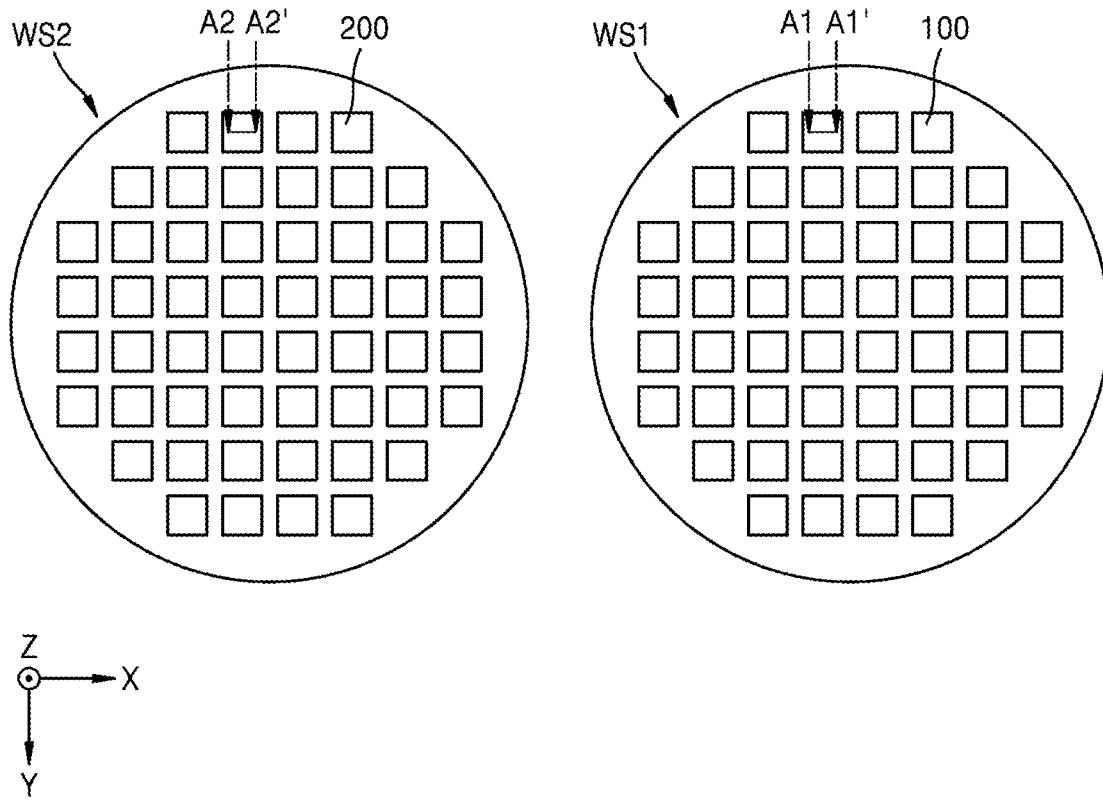
FIG. 4 is a diagram illustrating a manufacturing method of a chip stack structure according to example embodiments.

FIG. 4 is a diagram illustrating a manufacturing method of a chip stack structure according to some example embodiments.

Referring to FIG. 4, a first wafer WS1 having a plurality of first semiconductor chips 100 and a second wafer WS2 having a plurality of second semiconductor chips 200 are shown according to some example embodiments. The first wafer WS1 may include chip regions in which the first semiconductor chips 100 are formed and a scribe lane region separating the chip regions. The second wafer WS2 may include chip regions in which the second semiconductor chips 200 are formed and a scribe lane region separating the chip regions. A cross-section of the first semiconductor chip 100 shown in FIG. 3A may correspond to a cross-section taken along line A1-A1' of the first wafer WS1 shown in FIG. 4. A cross-section of the second semiconductor chip 200 shown in FIG. 3A may correspond to a cross-section taken along line A2-A2' of the second wafer WS2 shown in FIG. 4. The chip stack structure 10 may be formed through a wafer-to-wafer bonding process between the first wafer WS1 and the second wafer WS2. That is, after forming a wafer-level bonding structure in which the first wafer WS1 is bonded to the second wafer WS2 through a bonding process, the bonding structure may be cut through a sawing process to be divided into a plurality of chip stack structures 10.

In general, when manufacturing the bonding structure through the wafer-to-wafer bonding process, warpage may occur due to a mismatch in coefficient of thermal expansion (CTE) between individual components constituting the bonding structure, and such warpage may degrade quality of the bonding structure and semiconductor products produced from the bonding structure.

However, according to some example embodiments, the first wafer WS1, having first semiconductor chips 100, may be bonded to the second semiconductor chips 200 of the second wafer WS2 by a face-to-face bonding method, and warpage occurring in the bonding structure of the first wafer WS1 and the second wafer WS2 may be suppressed. In detail, because the first wafer WS1 may be bonded to the second wafer WS2 by the face-to-face bonding method, a direction of stress occurring in the first wafer WS1 may be the opposite to a direction of stress occurring in the second wafer WS2. Therefore, the stress occurring in the first wafer WS1 and the stress occurring in the second wafer WS2 may be canceled out. Because warpage may be suppressed in the bonding structure in which the first wafer WS1 is bonded to the second wafer WS2, the reliability of the bonding structure and the chip stack structure 10 manufactured from the bonding structure according to some example embodiments may be improved.

If a lower semiconductor chip and an upper semiconductor chip manufactured to have the same layout are disposed in a face-to-face manner, an arrangement order of bonding pads of the lower semiconductor chip may be opposite to an arrangement order of bonding pads of the upper semiconductor chip in a bonding interface between the lower semiconductor chip and the upper semiconductor chip. In this case, because the arrangement order of the bonding pads of the lower semiconductor chip is opposite to the arrangement order of the bonding pads of the upper semiconductor chip, the lower semiconductor chip may not be bonded to the upper semiconductor chip in the face-to-face manner. Accordingly, the first semiconductor chip 100 may include the redistribution layer 140 and the second pad layer 150 as a pad reposition layer configured to correct the pad arrangement order of the bonding pads of the first semiconductor chip 100. Thus, according to some example embodiments, the pad arrangement order of the bonding pads (i.e., the second conductive pads 150P) of the first semiconductor chip 100 may be the same as the pad arrangement order of the bonding pads (i.e., the third conductive pads 230P) of the second semiconductor chip 200 in the bonding interface between the first semiconductor chip 100 and the second semiconductor chip 200. Accordingly, the chip stack structure 10 in which the first semiconductor chip 100 is bonded to the second semiconductor chip 200 in a face-to-face manner may be provided.

Figure 5:
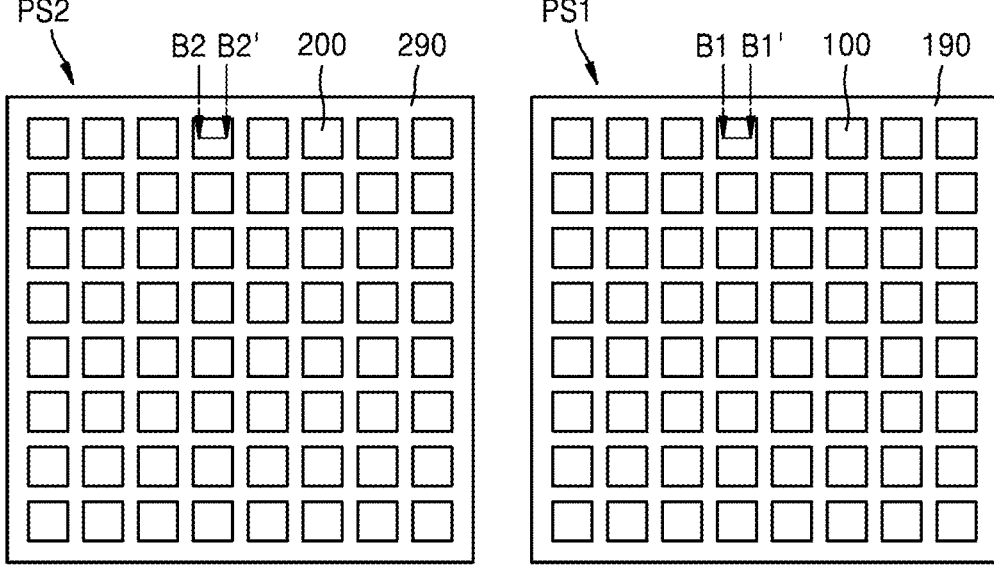
FIG. 5 is a diagram illustrating a manufacturing method of a chip stack structure according to example embodiments.
Figure 5:
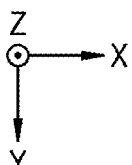

FIG. 5 is a diagram illustrating a manufacturing method of a chip stack structure according to some example embodiments.

Referring to FIG. 5, a first panel structure PS1 having the first semiconductor chips 100 and a second panel structure PS2 having the second semiconductor chips 200 are shown according to some example embodiments. The first panel structure PS1 may include the first semiconductor chips 100 and a first panel body 190 surrounding the first semiconductor chips 100. The second panel structure PS2 may include the second semiconductor chips 200 and a second panel body 290 surrounding the second semiconductor chips 200. The first semiconductor chips 100 included in the first panel structure PS1 may be chips determined to be good products through a test process, and the second semiconductor chips 200 included in the second panel structure PS2 may be chips determined to be good products through a test process. The first panel body 190 and the second panel body 290 may include, for example, an epoxy molding compound (EMC). Each of the first panel structure PS1 and the second panel structure PS2 may have a quadrangular shape in a plan view. A cross-section of the first semiconductor chip 100 shown in FIG. 3A may correspond to a cross-section taken along line B1-B1' of the first panel structure PS1 shown in FIG. 5. A cross-section of the second semiconductor chip 200 shown in FIG. 3A may correspond to a cross-section taken along line B2-B2' of the second panel structure PS2 shown in FIG. 5. The chip stack structure 10 may be formed through a panel-to-panel bonding process between the first panel structure PS1 and the second panel structure PS2. That is, after forming a panel-level bonding structure in which the first panel structure PS1 is bonded to the second panel structure PS2 through a bonding process, the bonding structure may be cut through a sawing process to be divided into a plurality of chip stack structures 10.

Figure 6:
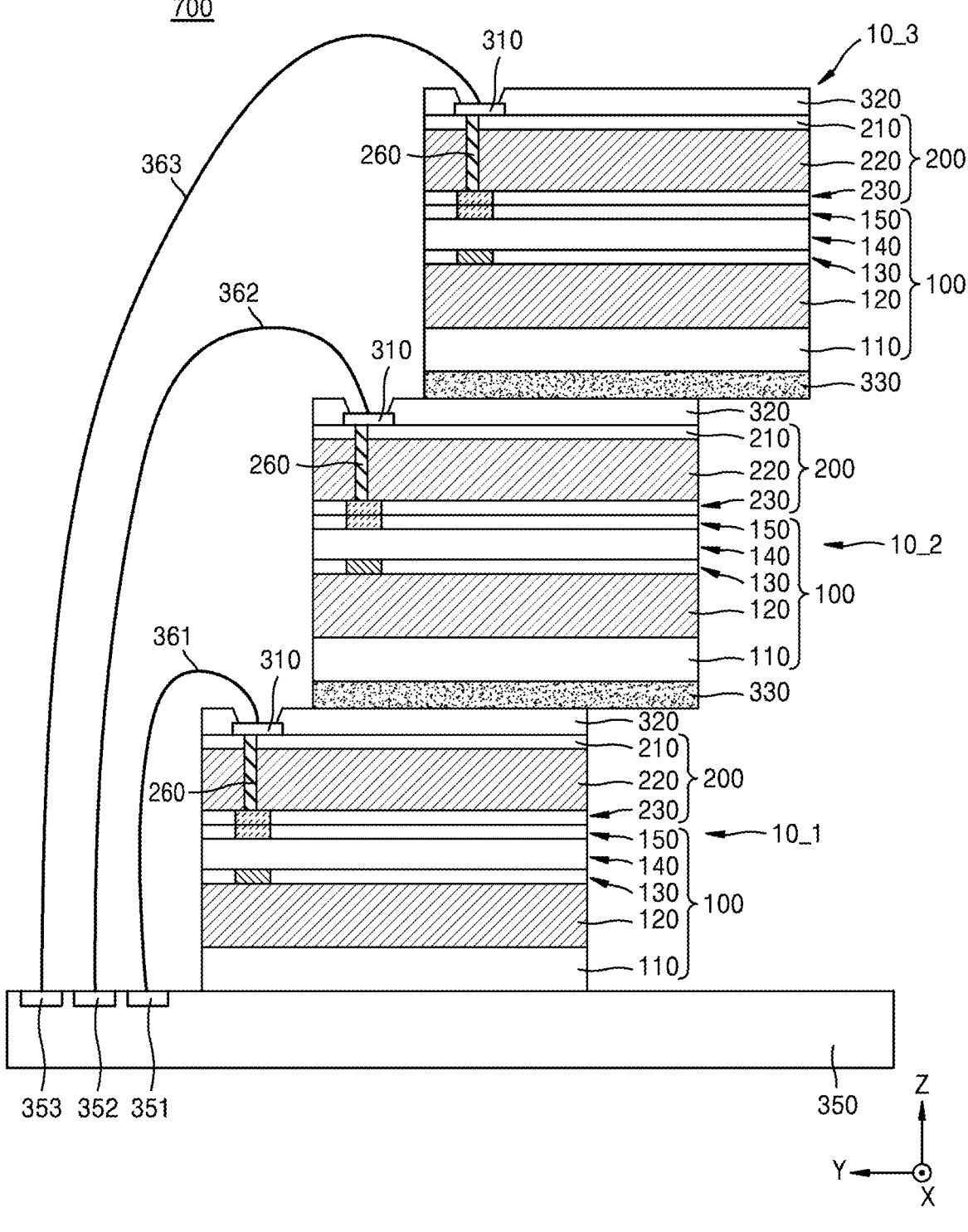
FIG. 6 is a cross-sectional view illustrating a semiconductor package according to example embodiments.

FIG. 6 is a cross-sectional view illustrating a semiconductor package 700 according to example embodiments.

Referring to FIG. 6, the semiconductor package 700 may include a package substrate 350 and a plurality of chip stack structures stacked in the vertical direction (the Z direction) according to some example embodiments.

The package substrate 350 may be, for example, a printed circuit board (PCB), a flexible board, or a tape board. The package substrate 350 may include substrate pads disposed on an upper surface of the package substrate 350.

Each of the chip stack structures may correspond to the chip stack structure 10 described above with reference to FIG. 1. For example, the chip stack structures may include a first chip stack structure 10_1 on the package substrate 350, a second chip stack structure 10_2 stacked on the first chip stack structure 10_1, and a third chip stack structure 10_3 stacked on the second chip stack structure 10_2. Although the semiconductor package 700 is illustrated as including three chip stack structures in FIG. 6, it is not limited thereto, and the semiconductor package 700 may include two or more chip stack structures stacked in the vertical direction (the Z direction).

In some example embodiments the chip stack structures may be stacked in an offset stack manner or a shift stack manner. In two adjacent chip stack structures, among the chip stack structures, an upper chip stack structure may be stacked to be offset from a lower chip stack structure in a lateral direction (i.e., the second horizontal direction (the Y direction)). A portion of the upper chip stack structure may protrude from one side of the lower chip stack structure in the lateral direction. As the upper chip stack structure is stacked to be offset from the lower chip stack structure in the lateral direction, a region in which the external connection pads 310 of the lower chip stack structure are disposed may be exposed.

An adhesive material layer 330 may be located between two adjacent chip stack structures, among the chip stack structures. In some example embodiments, the adhesive material layer 330 may be formed from a die attach film (DAF). In some example embodiments, the adhesive material layer 330 may be formed from a non-conductive film or non-conductive paste.

Each of the plurality of chip stack structures may be electrically connected to the package substrate 350 through conductive wires. The semiconductor package 700 may include a first conductive wire 361 extending between the external connection pad 310 of the first chip stack structure 10_1 and a first substrate pad 351 of the package substrate 350, a second conductive wire 362 extending between the external connection pad 310 of the chip stack structure 10_2 and a second substrate pad 352 of the package substrate 350, and a third conductive wire 363 extending between the external connection pad 310 of the third chip stack structure 10_3 and a third substrate pad 353 of the package substrate 350.

Generally, in a semiconductor package having a plurality of chips stacked in the vertical direction (the Z direction), one DAF is located between two chips. Because a thickness of the semiconductor package is determined by a thickness of each chip and a thickness of each DAF, the thickness of the semiconductor package is reduced by a decrement of a total thickness of the DAFs. According to some example embodiments, the chip stack structures are mutually stacked through the DAF, and each chip stack structure may include two semiconductor chips directly bonded using a hybrid direct bonding method. Accordingly, in the semiconductor package 700, a total number of DAFs required to stack semiconductor chips may be less than half of a total number of semiconductor chips included in the semiconductor package 700. As the total number of DAFs decreases, the semiconductor package 700 may be miniaturized and the number of semiconductor chips accommodated within the limited thickness of the semiconductor package 700 may increase.

In addition, compared to a general semiconductor package in which each chip has one passivation layer, in the semiconductor package 700 according to some example embodiments, each chip stack structure includes two semiconductor chips and may have one passivation layer 320, and thus, the number of layers of the passivation layer 320 per number of chips may be reduced. As the number of layers of the passivation layer 320 is reduced, the semiconductor package 700 according to some example embodiments may be miniaturized and the number of semiconductor chips accommodated within a limited thickness of the semiconductor package 700 may increase.

Furthermore, according to some example embodiments, because warpage that occurs during a manufacturing process may be suppressed by bonding the first semiconductor chip 100 (or the first wafer WS1 having the first semiconductor chips 100) to the second semiconductor chip 200 (or the second wafer WS2 having the second semiconductor chips 200) in a face-to-face manner, the first semiconductor substrate 110 of the first semiconductor chip 100 may be formed to be relatively thin in each chip stack structure. Because the thickness of the first semiconductor substrate 110 of the first semiconductor chip 100 may be reduced in each chip stack structure, the semiconductor package 700 may be miniaturized and the number of semiconductor chips that may be accommodated within a limited thickness of the semiconductor package 700 may increase.

Figure 7:
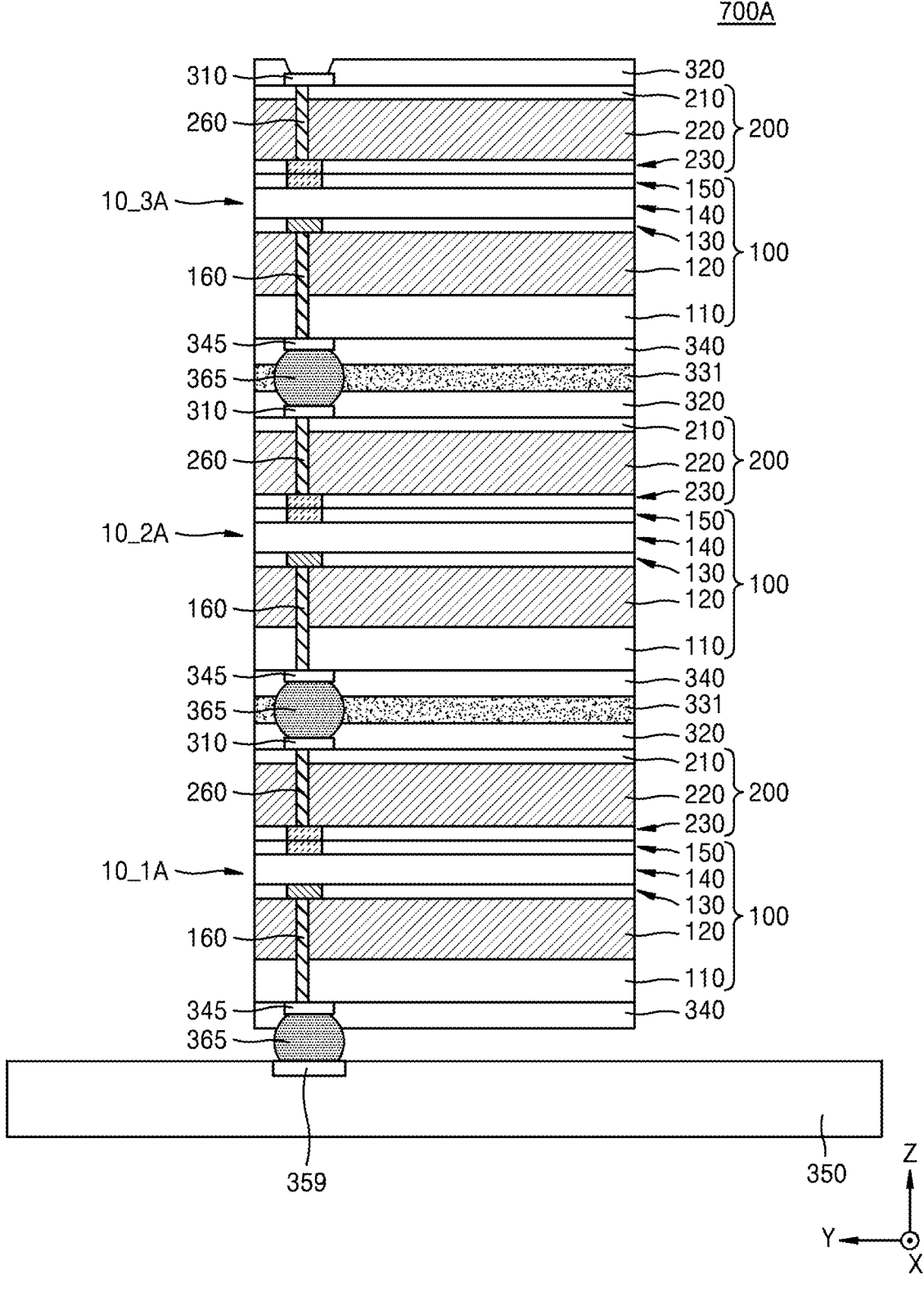
FIG. 7 is a cross-sectional view illustrating a semiconductor package according to example embodiments.

FIG. 7 is a cross-sectional view illustrating a semiconductor package 700A according to some example embodiments. Hereinafter, the semiconductor package 700A shown in FIG. 7 is described, focusing on differences from the semiconductor package 700 described above with reference to FIG. 6.

Referring to FIG. 7, some example embodiments of the semiconductor package 700A may include the package substrate 350 and a plurality of chip stack structures mutually stacked in the vertical direction (the Z direction). For example, the chip stack structures may include a first chip stack structure 10_1A on the package substrate 350, a second chip stack structure 10_2A stacked on the first chip stack structure 10_1A, and a third chip stack structure 10_3A stacked on the second chip stack structure 10_2A. Each chip stack structure may include a lower pad 345 disposed below the first semiconductor substrate 110 of the first semiconductor chip 100, a vertical connection conductor 160 at least partially passing through the first semiconductor chip 100 and electrically connecting the lower pad 345 to the first conductive pads (refer to first conductive pads 130P of FIG. 2), and a passivation layer 340 disposed below the first semiconductor substrate 110 of the first semiconductor chip 100 and at least partially covering the lower pad 345. The first semiconductor chip 100 may include a first pad layer 130, a first redistribution layer 140 on the first pad layer 130, and a second pad layer 150 on the first redistribution layer 140 (refer to first pad layer 130, first redistribution layer 140, and second pad layer 150 FIG. 2). The second semiconductor chip 200 may include a third pad layer 230 (refer to third pad layer 230 FIG. 2).

The chip stack structures may be aligned with one another in the vertical direction (the Z direction) and may be electrically connected to each other through connection bumps 365. The connection bumps 365 may include, for example, solder. Between two adjacent chip stack structures, the connection bump 365 may contact the lower pad 345 of the upper chip stack structure and the external connection pad 310 of the lower chip stack structure, and an adhesive material layer 331 may surround the connection bump 365. For example, the second chip stack structure 10_2A may be electrically and physically connected to the first chip stack structure 10_1A through the connection bump 365 located between the first chip stack structure 10_1A and the second chip stack structure 10_2A, and the third chip stack structure 10_3A may be electrically and physically connected to the second chip stack structure 10_2A through the connection bump 365 located between the second chip stack structure 10_2A and the third chip stack structure 10_3A. Between the first chip stack structure 10_1A and the package substrate 350, the connection bump 365 may contact the lower pad 345 of the first chip stack structure 10_1A and a substrate pad 359 of the package substrate 350.

Figure 8:
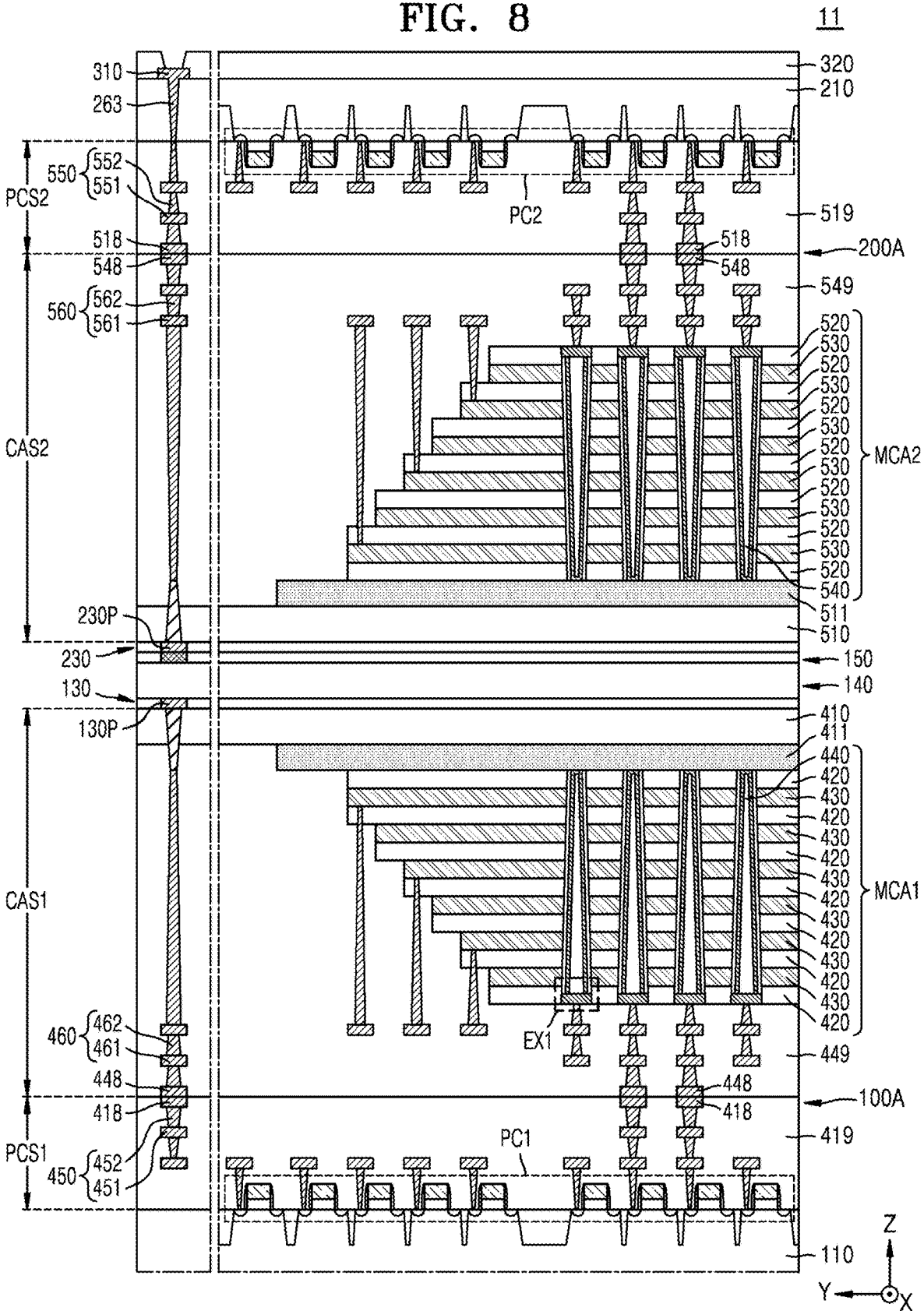
FIG. 8 is a cross-sectional view illustrating a chip stack structure according to example embodiments.
Figure 9:
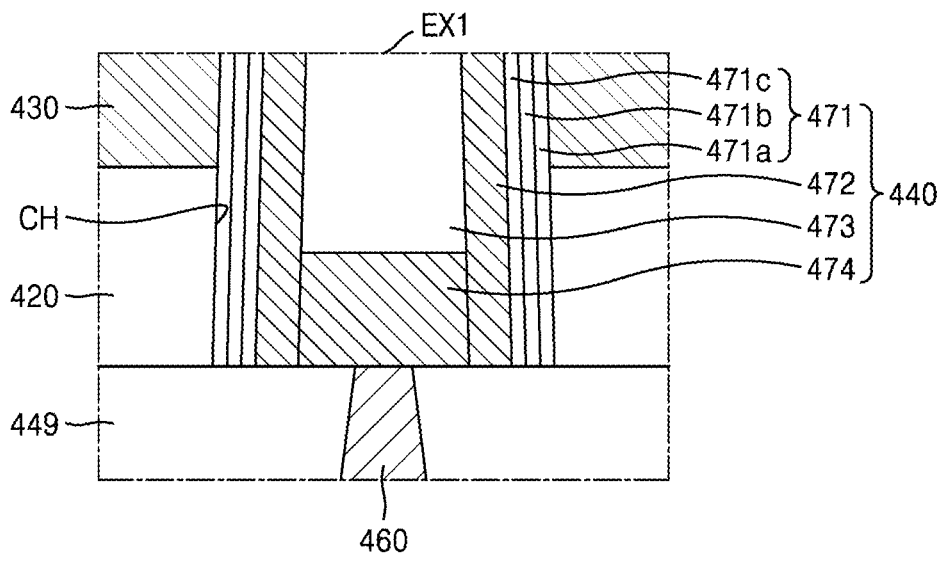
FIG. 9 is an enlarged view of area "EX1" in FIG. 8 according to example embodiments.

FIG. 8 is a cross-sectional view illustrating a chip stack structure 11 according to some example embodiments. FIG. 9 is an enlarged view of region "EX1" of FIG. 8. Hereinafter, for convenience of description, differences from the chip stack structure described above are mainly described.

Referring to FIGS. 8 and 9, some example embodiments of the chip stack structure 11 may include a first semiconductor chip 100A and a second semiconductor chip 200A bonded to each other, and each of the first semiconductor chip 100A and the second semiconductor chip 200A may include a vertical NAND flash memory device. The first semiconductor chip 100A may include a first peripheral circuit structure PCS1 and a first cell array structure CAS1 on the first peripheral circuit structure PCS1. In the first semiconductor chip 100A, the first peripheral circuit structure PCS1 and the first cell array structure CAS1 may constitute a first semiconductor device layer of the first semiconductor chip 100A. The second semiconductor chip 200A may include a second peripheral circuit structure PCS2 and a second cell array structure CAS2 below the second peripheral circuit structure PCS2. In the second semiconductor chip 200A, the second peripheral circuit structure PCS2 and the second cell array structure CAS2 may constitute a second semiconductor device layer of the second semiconductor chip 200A.

In the first semiconductor chip 100A, the first peripheral circuit structure PCS1 may be combined with the first cell array structure CAS1. For example, a first bonding pad 418 of the first peripheral circuit structure PCS1 may be combined with a second bonding pad 448 of the first cell array structure CAS1. In addition, a first insulating layer 419 of the first peripheral circuit structure PCS1 may be combined with a second insulating layer 449 of the first cell array structure CAS1.

Example embodiments of the first peripheral circuit structure PCS1 may include a first peripheral circuit PC1 on an upper surface of the first semiconductor substrate 110, the first insulating layer 419 covering the first semiconductor substrate 110 and the first peripheral circuit PC1, and the first bonding pad 418 disposed on the first insulating layer 419. Also, the first peripheral circuit structure PCS1 may include a first wiring structure 450.

Example embodiments of the first cell array structure CAS1 may include a first insulating structure 410, a first conductive plate 411 below the first insulating structure 410, a first memory cell array MCA1 below the first conductive plate 411, a second insulating layer 449 covering the first insulating structure 410 and the first memory cell array MCA1, and a second bonding pad 448 disposed on the second insulating layer 449. Also, the first cell array structure CAS1 may include a second wiring structure 460.

First, a detailed configuration of example embodiments of the first peripheral circuit structure PCS1 is as follows.

Example embodiments of the first peripheral circuit PC1 may include a plurality of transistors on the first semiconductor substrate 110. An STI structure may be located between the transistors. For example, in the first peripheral circuit PC1, the transistors may constitute a data I/O circuit (refer to 95 in FIG. 10), a row decoder (refer to 91 in FIG. 10), a page buffer (refer to 93 in FIG. 10), a control logic (refer to 37 in FIG. 10), and/or a common source line driver (refer to 39 in FIG. 10).

The first wiring structure 450 may electrically connect the first peripheral circuit PC1 to the first bonding pad 418. The first wiring structure 450 may include a plurality of first conductive lines 451 located at different vertical levels within the first insulating layer 419 and a plurality of first vias 452 extending in a vertical direction within the first insulating layer 419. The first vias 452 may electrically connect the first conductive lines 451 located at different vertical levels to each other.

The first wiring structure 450 may include a metal material, such as copper (Cu), aluminum (Al), tungsten (W), silver (Ag), or gold (Au). In some embodiments, the first wiring structure 450 may further include a barrier material, such as titanium (Ti), tantalum (Ta), titanium nitride (TiN), or tantalum nitride (TaN) to prevent diffusion of the metal material into the first insulating layer 419.

The first insulating layer 419 may be disposed to cover the first semiconductor substrate 110 and the first peripheral circuit PC1. The first insulating layer 419 may include, for example, silicon oxide, silicon nitride, a low-k material, or combinations thereof. The low-k material is a material having a lower dielectric constant than that of silicon oxide and may include, for example, phosphosilicate glass (PSG), borophosphosilicate glass (BPSG), fluorosilicate glass (FSG), organosilicate glass (OSG), spin-on-glass (SOG), or combinations thereof.

Next, a detailed configuration of some example embodiments of the first cell array structure CAS1 is as follows.

Example embodiments of the first insulating structure 410 may have lower and upper surfaces facing each other. The first insulating structure 410 may include silicon oxide, silicon nitride, silicon oxynitride, or combinations thereof.

A first conductive plate 411 may be disposed on the lower surface of the first insulating structure 410. The first conductive plate 411 may include a metal material, a semiconductor material, or combinations thereof.

The first memory cell array MCA1 may include a plurality of first interlayer insulating layers 420 and a plurality of first gate layers 430 alternately stacked on the lower surface of the first conductive plate 411 and a plurality of first channel structures 440 passing through the first interlayer insulating layer 420 and the first gate layers 430. The first gate layers 430 may have a step structure in which a planar area gradually decreases in a direction away from the first conductive plate 411.

The first interlayer insulating layers 420 may include silicon oxide, silicon nitride, a low-k material, or combinations thereof. The first interlayer insulating layers 420 may include a material that is different from a material constituting the second insulating layer 449.

The first gate layers 430 may include a metal material, such as copper (Cu), aluminum (Al), tungsten (W), silver (Ag), or gold (Au). In some example embodiments, each of the first gate layers 430 may further include a barrier material, such as titanium (Ti), tantalum (Ta), titanium nitride (TiN), or tantalum nitride (TaN) to prevent diffusion of the metal material into the first interlayer insulating layers 420.

The first channel structure 440 may be located in a channel hole CH passing through the first interlayer insulating layers 420 and the first gate layers 430 in the vertical direction (the Z direction). Each of the first channel structures 440 may include a gate insulating layer 471 on a side surface of the channel hole CH, a channel layer 472 on the gate insulating layer 471, a filling insulating layer 473 on the channel layer 472, and a channel pad 474 filling a lower portion of the channel hole CH.

The gate insulating layer 471 may include a blocking insulating layer 471a, a charge storage layer 471b, and a tunneling insulating layer 471c sequentially stacked on the channel hole CH. The blocking insulating layer 471a may include, for example, silicon oxide, silicon nitride, a metal oxide having permittivity higher than that of silicon oxide, or combinations thereof. The charge storage layer 471b may include, for example, silicon nitride, boron nitride, polysilicon, or combinations thereof. The tunneling insulating layer 471c may include, for example, metal oxide or silicon oxide.

The channel layer 472 may surround a side surface and one end portion of the filling insulating layer 473. The channel layer 472 may include a group IV semiconductor material, a group III-V semiconductor material, or a group II-VI semiconductor material. In some example embodiments, the channel layer 472 may include polysilicon.

The filling insulating layer 473 may fill a space surrounded by the channel layer 472 and the channel pad 474. The filling insulating layer 473 may include, for example, silicon nitride, silicon oxide, a low dielectric material, or combinations thereof. In some example embodiments, the filling insulating layer 473 may include silicon oxide.

The channel pad 474 may contact the gate insulating layer 471, the channel layer 472, and the filling insulating layer 473. The channel pad 474 may include a semiconductor material, such as silicon (Si), germanium (Ge), or silicon germanium (SiGe), a metal material, such as tungsten (W), titanium (Ti), aluminum (Al), copper (Cu), gold (Au), or silver (Ag), a metal nitride, such as titanium nitride (TiN) or tantalum nitride (TaN), or combinations thereof.

Example embodiments of the second wiring structure 460 may include a plurality of second conductive lines 461 located at different vertical levels within the second insulating layer 449 and a plurality of second vias 462 extending in a vertical direction within the second insulating layer 449. The second vias 462 may electrically connect the second conductive lines 461 located at different vertical levels to each other. In the first semiconductor chip 100A, the second wiring structure 460 may constitute a vertical connection conductor electrically connecting the first conductive pads 130P (refer to first conductive pads 130P in FIG. 2) of the first pad layer 130 to the first bonding pad 418 of the first peripheral circuit structure PCS1. The first semiconductor chip 100 may include a first pad layer 130, a first redistribution layer 140 on the first pad layer 130, and a second pad layer 150 on the first redistribution layer 140 (refer to first pad layer 130, first redistribution layer 140, and second pad layer 150 in FIG. 2).

The second wiring structure 460 may include a metal material, such as copper (Cu), aluminum (Al), tungsten (W), silver (Ag), or gold (Au). In some example embodiments, the second wiring structure 460 may include a barrier material, such as titanium (Ti), tantalum (Ta), titanium nitride (TiN), or tantalum nitride (TaN) to prevent diffusion of the metal material into the second insulating layer 449.

The second insulating layer 449 may include, for example, silicon oxide, silicon nitride, a low-k material, or combinations thereof. The low-k material may be a material having a dielectric constant lower than that of silicon oxide, and may include, for example, PSG, BPSG, FSG, OSG, SOG, or combinations thereof.

In some example embodiments of the second semiconductor chip 200A, the second peripheral circuit structure PCS2 may be combined with the second cell array structure CAS2. For example, a third bonding pad 518 of the second peripheral circuit structure PCS2 may be combined with a third bonding pad 548 of the second cell array structure CAS2. In addition, a third insulating layer 519 of the second peripheral circuit structure PCS2 may be combined with a fourth insulating layer 549 of the second cell array structure CAS2.

The second peripheral circuit structure PCS2 may include a second peripheral circuit PC2 on the lower surface of the second semiconductor substrate 210, a third insulating layer 519 covering the second semiconductor substrate 210 and the second peripheral circuit PC2, and a third bonding pad 518 disposed on a lower surface of the third insulating layer 519. Also, the second peripheral circuit structure PCS2 may include a third wiring structure 550.

The second cell array structure CAS2 may include a second insulating structure 510, a second conductive plate 511 below the second insulating structure 510, a second memory cell array MCA2 below the second conductive plate 511, a fourth insulating layer 549 covering the second insulating structure 510 and the second memory cell array MCA2, and a third bonding pad 548 disposed on an upper surface of the fourth insulating layer 549. In addition, the second cell array structure CAS2 may include a fourth wiring structure 560.

First, a detailed configuration of some example embodiments of the second peripheral circuit structure PCS2 is as follows.

Example embodiments of the second peripheral circuit PC2 may include a plurality of transistors formed on the lower surface of the second semiconductor substrate 210 or within the second semiconductor substrate 210. An STI may be located between the transistors. For example, in the second peripheral circuit PC2, the transistors may constitute a data I/O circuit (refer to 95 in FIG. 10), a row decoder (refer to 91 in FIG. 10), a page buffer (refer to 93 in FIG. 10), and control logic (refer to 37 in FIG. 10), and/or a common source line driver (refer to 39 in FIG. 10).

The third wiring structure 550 may electrically connect the second peripheral circuit PC2 to the third bonding pad 518. The third wiring structure 550 may include a plurality of third conductive lines 551 located at different vertical levels within the third insulating layer 519 and a plurality of third vias 552 extending in a vertical direction within the third insulating layer 519. The third vias 552 may electrically connect the third conductive lines 551 located at different vertical levels to each other.

The third wiring structure 550 may include a metal material, such as copper (Cu), aluminum (Al), tungsten (W), silver (Ag), or gold (Au). In some example embodiments, the third wiring structure 550 may further include a barrier material, such as titanium (Ti), tantalum (Ta), titanium nitride (TiN), tantalum nitride (TaN) to prevent diffusion of the metal material into the third insulating layer 519.

The third insulating layer 519 may be disposed to cover the second semiconductor substrate 210 and the second peripheral circuit PC2. The third insulating layer 519 may include, for example, silicon oxide, silicon nitride, a low-k material, or combinations thereof. The low-k material may be a material having a dielectric constant lower than that of silicon oxide, and may include, for example, PSG, BPSG, FSG, OSG, spin-on-glass, or combinations thereof.

Next, a detailed configuration of some example embodiments of the second cell array structure CAS2 is as follows.

Example embodiments of the second insulating structure 510 may have lower and upper surfaces facing each other. The second insulating structure 510 may include silicon oxide, silicon nitride, silicon oxynitride, or combinations thereof.

The second conductive plate 511 may be disposed on an upper surface of the second insulating structure 510. The second conductive plate 511 may include a metal material, a semiconductor material, or combinations thereof.

The second memory cell array MCA2 may include a plurality of second interlayer insulating layers 520 and a plurality of second gate layers 530 alternately stacked on the second conductive plate 511 and a plurality of second channel structures 540 passing through the second interlayer insulating layers 520 and the second gate layers 530. The second gate layers 530 may have a step structure in which a planar area gradually decreases in a direction away from the second conductive plate 511.

The plurality of second interlayer insulating layers 520 may include silicon oxide, silicon nitride, a low-k material, or combinations thereof. The second interlayer insulating layers 520 may include a material that is different from a material constituting the fourth insulating layer 549.

The second gate layers 530 may include a metal material, such as copper (Cu), aluminum (Al), tungsten (W), silver (Ag), or gold (Au). In some example embodiments, each second gate layer 530 may further include a barrier material, such as titanium (Ti), tantalum (Ta), titanium nitride (TiN), or tantalum nitride (TaN) to prevent diffusion of the metal material into the second interlayer insulating layers 520.

The second channel structure 540 may be located in a channel hole passing through the second interlayer insulating layers 520 and the second gate layers 530 in a vertical direction (the Z direction). Each of the second channel structures 540 may include a gate insulating layer on a side surface of the channel hole, a channel layer on the gate insulating layer, a filling insulating layer on the channel layer, and a channel pad filling an upper portion of the channel hole. A detailed configuration of the second channel structure 540 is substantially the same as the detailed configuration of the first channel structure 440, and thus, a description thereof is omitted here.

Example embodiments of the fourth wiring structure 560 may include a plurality of fourth conductive lines 561 located at different vertical levels within the fourth insulating layer 549 and a plurality of fourth vias 562 extending in a vertical direction within the fourth insulating layer 549. The fourth vias 562 may electrically connect the fourth conductive lines 561 located at different vertical levels to each other. In the second semiconductor chip 200A, the third wiring structure 550 and the fourth wiring structure 560 may constitute a vertical connection conductor electrically connecting the external connection pad 310 to the third conductive pads 230P of the third pad layer 230 (refer to third pad layer 230 and third conductive pads 230P in FIG. 2).

The fourth wiring structure 560 may include a metal material, such as copper (Cu), aluminum (Al), tungsten (W), silver (Ag), or gold (Au). In some example embodiments, the fourth wiring structure 560 may include a barrier material, such as titanium (Ti), tantalum (Ta), titanium nitride (TiN), or tantalum nitride (TaN) to prevent diffusion of the metal material into the fourth insulating layer 549.

The fourth insulating layer 549 may include, for example, silicon oxide, silicon nitride, a low-k material, or combinations thereof. The low-k material may be a material having a dielectric constant lower than that of silicon oxide, and may include, for example, PSG, BPSG, FSG, OSG, SOG, or combinations thereof.

Figure 10:
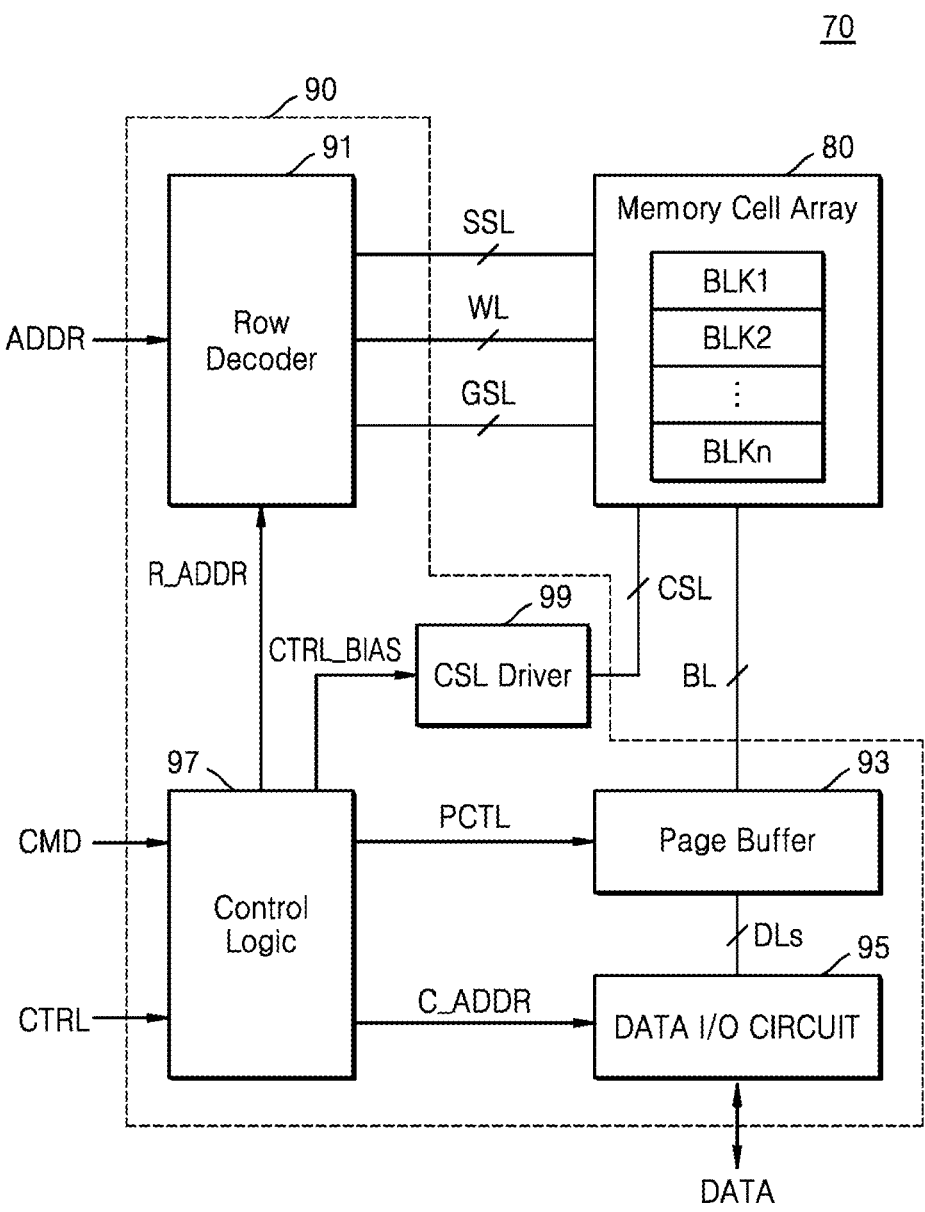
FIG. 10 is a block diagram illustrating a semiconductor chip according to example embodiments.

FIG. 10 is a block diagram illustrating a semiconductor chip 70 according to some example embodiments.

Referring to FIG. 10, some example embodiments of the semiconductor chip 70 may include a memory cell array 80 and a peripheral circuit 90. A description of the semiconductor chip 70 may refer to the description of at least one of the first semiconductor chip 100 and the second semiconductor chip 200 of the chip stack structure 10 of FIG. 1 in whole or in part.

The memory cell array 80 includes a plurality of memory cell blocks BLK1, BLK2, . . . , BLKn. Each of the plurality of memory cell blocks BLK1, BLK2, . . . , BLKn may include a plurality of memory cells. The plurality of memory cell blocks BLK1, BLK2, . . . , BLKn may be connected to the peripheral circuit 90 through a bit line BL, a word line WL, a string select line SSL, and a ground select line GSL.

The memory cell array 80 may be connected to a page buffer 93 through a bit line BL and may be connected to a row decoder 91 through a word line WL, a string select line SSL, and a ground select line GSL. In the memory cell array 80, each of the memory cells included in the memory cell blocks BLK1, BLK2, . . . , BLKn may be a flash memory cell. The memory cell array 80 may include a 3D memory cell array. The 3D memory cell array may include a plurality of NAND strings, and each of the NAND strings may include a plurality of memory cells connected to a plurality of vertically stacked word lines WL.

The peripheral circuit 90 may include a row decoder 91, a page buffer 93, a data I/O circuit 95, a control logic 97, and a common source line (CSL) driver 99. Although not shown, the peripheral circuit 90 may further include various circuits, such as a voltage generating circuit generating various voltages necessary for an operation of the semiconductor chip 70, an error correction circuit correcting errors in data read from the memory cell array 80, and an I/O interface.

The peripheral circuit 90 may receive an address ADDR, a command CMD, and/or a control signal CTRL from the outside of the semiconductor chip 70. Additionally, the peripheral circuit 90 may transmit and receive data DATA to and from a device outside the semiconductor chip 70.

An example embodiment of the peripheral circuit 90 is as follows.

In response to the address ADDR from the outside, the row decoder 91 may select at least one of the memory cell blocks BLK1, BLK2, . . . , BLKn, and may select the word line WL, the string select line SSL, and the ground select line GSL of the selected memory cell block. The row decoder 91 may transfer a voltage for performing a memory operation to the word line WL of the selected memory cell block.

The page buffer 93 may be connected to the memory cell array 80 through the bit line BL. During a program operation, the page buffer 93 may operate as a write driver to apply a voltage according to the data DATA to be stored in the memory cell array 80 to the bit line BL, and during a read operation, the page buffer 93 may operate as a sense amplifier to sense the data DATA stored in the memory cell array 80. The page buffer 93 may operate according to a control signal PCTL provided from the control logic 97.

The data I/O circuit 95 may be connected to the page buffer 93 through data lines DLs. During a program operation, the data I/O circuit 95 may receive data DATA from the controller (refer to 1200 in FIG. 13) and provide program data DATA to the page buffer 93 based on a column address C_ADDR provided from the control logic 97. During a read operation, the data I/O circuit 95 may provide the read data DATA stored in the page buffer 93 to the controller 1200 based on the column address C_ADDR provided from the control logic 97. The data I/O circuit 95 may transfer an input address or command to the control logic 97 or the row decoder 91.

The control logic 97 may receive a command CMD and a control signal CTRL from the controller 1200. The control logic 97 may provide row address R_ADDR to the row decoder 91 and the column address C_ADDR to the data I/O circuit 95. The control logic 97 may generate various internal control signals used in the semiconductor chip 70 in response to the control signal CTRL. For example, the control logic 97 may adjust voltage levels provided to the word line WL and the bit line BL when a memory operation, such as a program operation or an erase operation, is performed.

The CSL driver 99 may be connected to the memory cell array 80 through a common source line CSL. The CSL driver 99 may apply a common source voltage (e.g., a power supply voltage) or a ground voltage to the common source line CSL based on the control signal CTRL_BIAS of the control logic 97.

Figure 11:
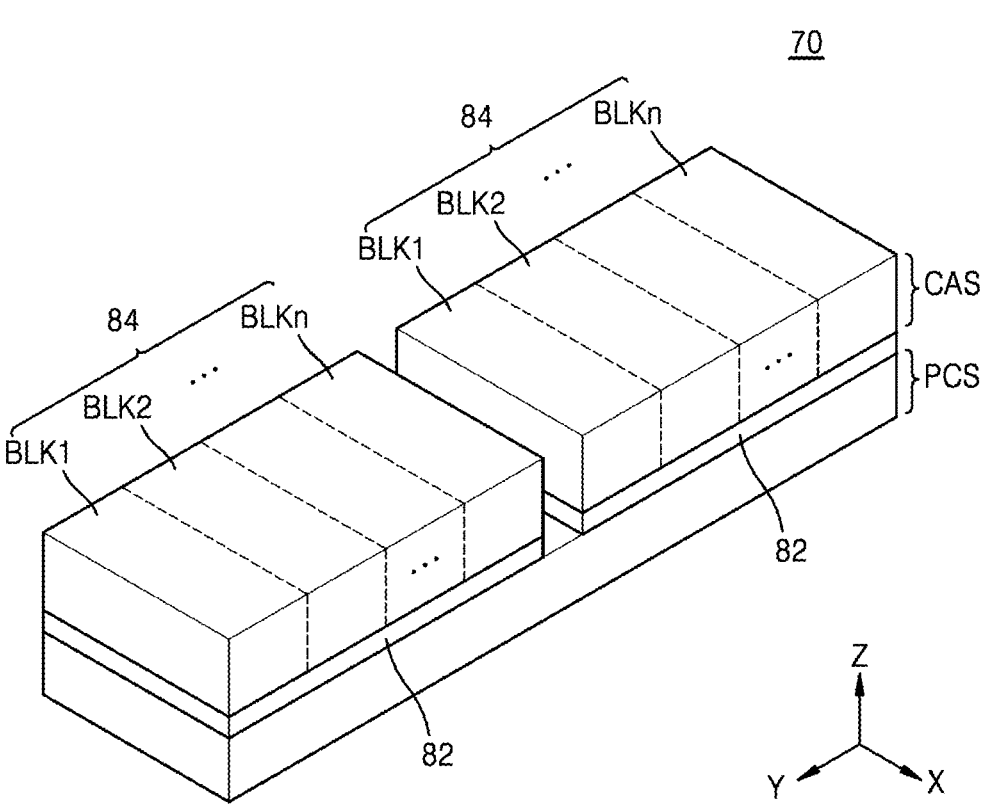
FIG. 11 is a perspective view schematically illustrating a semiconductor chip according to example embodiments.

FIG. 11 is a schematic perspective view of the semiconductor chip 70 according to some example embodiments.

Referring to FIG. 11, some example embodiments of the semiconductor chip 70 include a peripheral circuit structure PCS and a cell array structure CAS overlapping each other in a vertical direction.

The cell array structure CAS may include a memory cell array (80 in FIG. 10), and the peripheral circuit structure PCS may include a peripheral circuit (80 in FIG. 10).

A connection structure 82 may be located between the cell array structure CAS and the peripheral circuit structure PCS. The cell array structure CAS and the peripheral circuit structure PCS may be vertically stacked through the connection structure 82. The connection structure 82 may provide physical and electrical connection between the cell array structure CAS and the peripheral circuit structure PCS. Electrical connection and data transmission may be performed between the cell array structure CAS and the peripheral circuit structure PCS through the connection structure 82.

The connection structure 82 may include a plurality of connection portions electrically connecting the cell array structure CAS to the peripheral circuit structure PCS. The connection portions may include a metal-metal bonding structure, a through silicon via (TSV), a back via stack (BVS), a eutectic bonding structure, a ball grid array bonding (BGA) structure, a plurality of wiring lines, a plurality of contact plugs, or combinations thereof. For example, the metal-metal bonding structure may include copper (Cu), aluminum (Al), tungsten (W), or combinations thereof.

The cell array structure CAS may include a plurality of tiles 84. Each of the tiles 84 may include a plurality of memory cell blocks BLK1, BLK2, . . . , BLKn. Each of the plurality of memory cell blocks BLK1, BLK2, . . . , BLKn may include three-dimensionally arranged memory cells.

Figure 12:
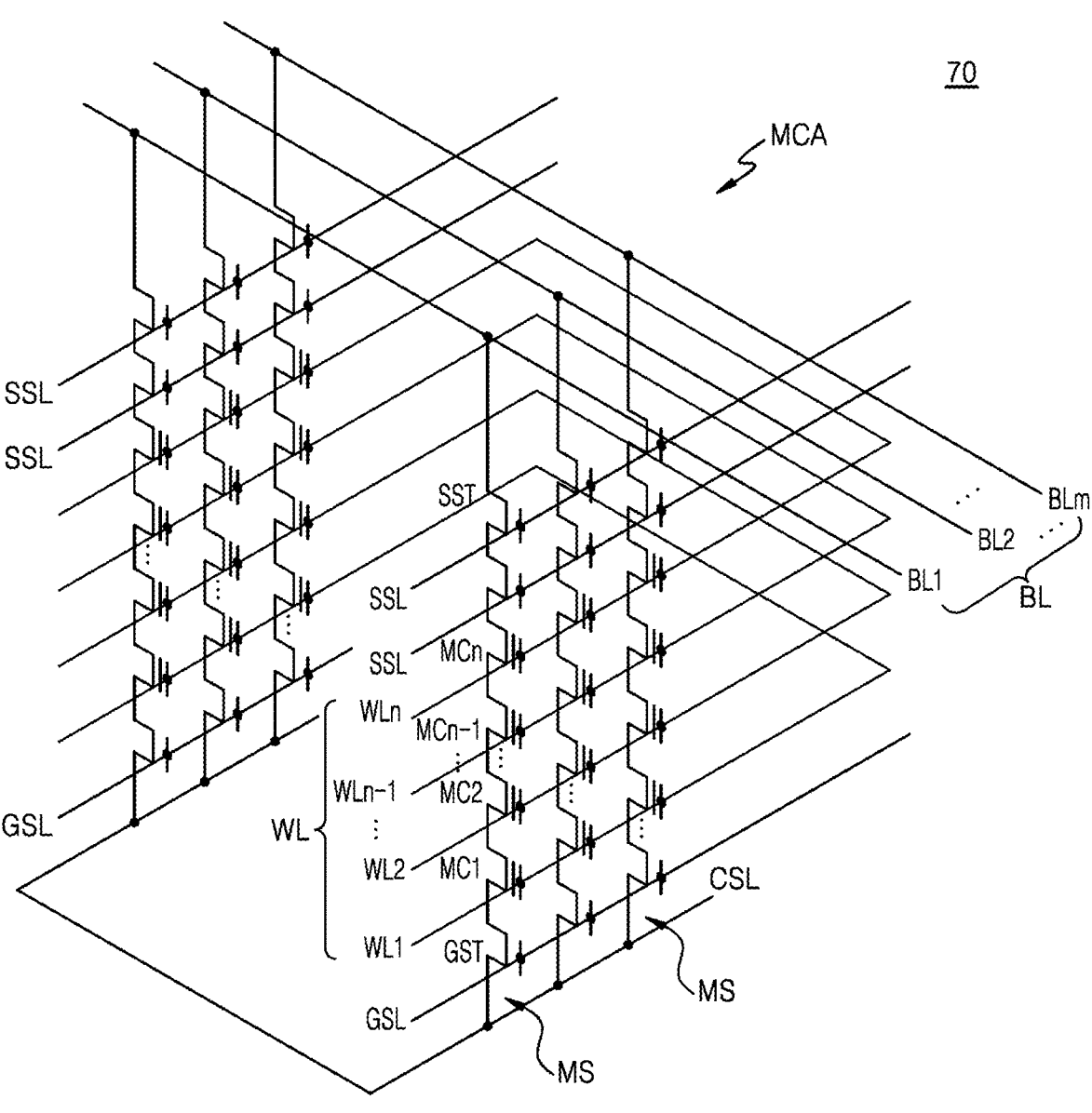
FIG. 12 is an equivalent circuit diagram illustrating a memory cell array of a semiconductor chip according to example embodiments.

FIG. 12 is an equivalent circuit diagram illustrating a memory cell array (MCA) of the semiconductor chip 70 according to some example embodiments.

Referring to FIG. 12, an equivalent circuit diagram of a vertical NAND flash memory device having a vertical channel structure according to some example embodiments is illustrated. In the semiconductor chip 70, the memory cell array MCA may include a plurality of memory cell strings MS. The memory cell array MCA may include a plurality of bit lines BL, a plurality of word lines WL, at least one string select line SSL, at least one ground select line GSL, and a common source line CSL.

The memory cell strings MS may be formed between the bit lines BL and the common source line CSL. In the drawing, a case in which each of the memory cell strings MS includes two string select lines SSL is illustrated, but the inventive concept is not limited thereto. For example, each of the memory cell strings MS may include one string select line SSL.

Each of the memory cell strings MS may include a string select transistor SST, a ground select transistor GST, and a plurality of memory cell transistors MC1, MC2, . . . , MCn−1, MCn. A drain region of the string select transistor SST may be connected to the bit line BL, and a source region of the ground select transistor GST may be connected to the common source line CSL. The common source line CSL may be a region to which source regions of the ground select transistors GST are connected in common.

The string select transistor SST may be connected to the string select line SSL, and the ground select transistor GST may be connected to the ground select line GSL. The memory cell transistors MC1, MC2, . . . , MCn−1, and MCn may be connected to a plurality of word lines WL1, WL2, . . . , WLn−1, and WLn, respectively.

Each of the memory cell blocks BLK1, BLK2, . . . , BLKn described above with reference to some example embodiments depicted in FIGS. 10 and 11 may include the memory cell array MCA having the circuit configuration described above with reference to FIG. 12.

Figure 13:
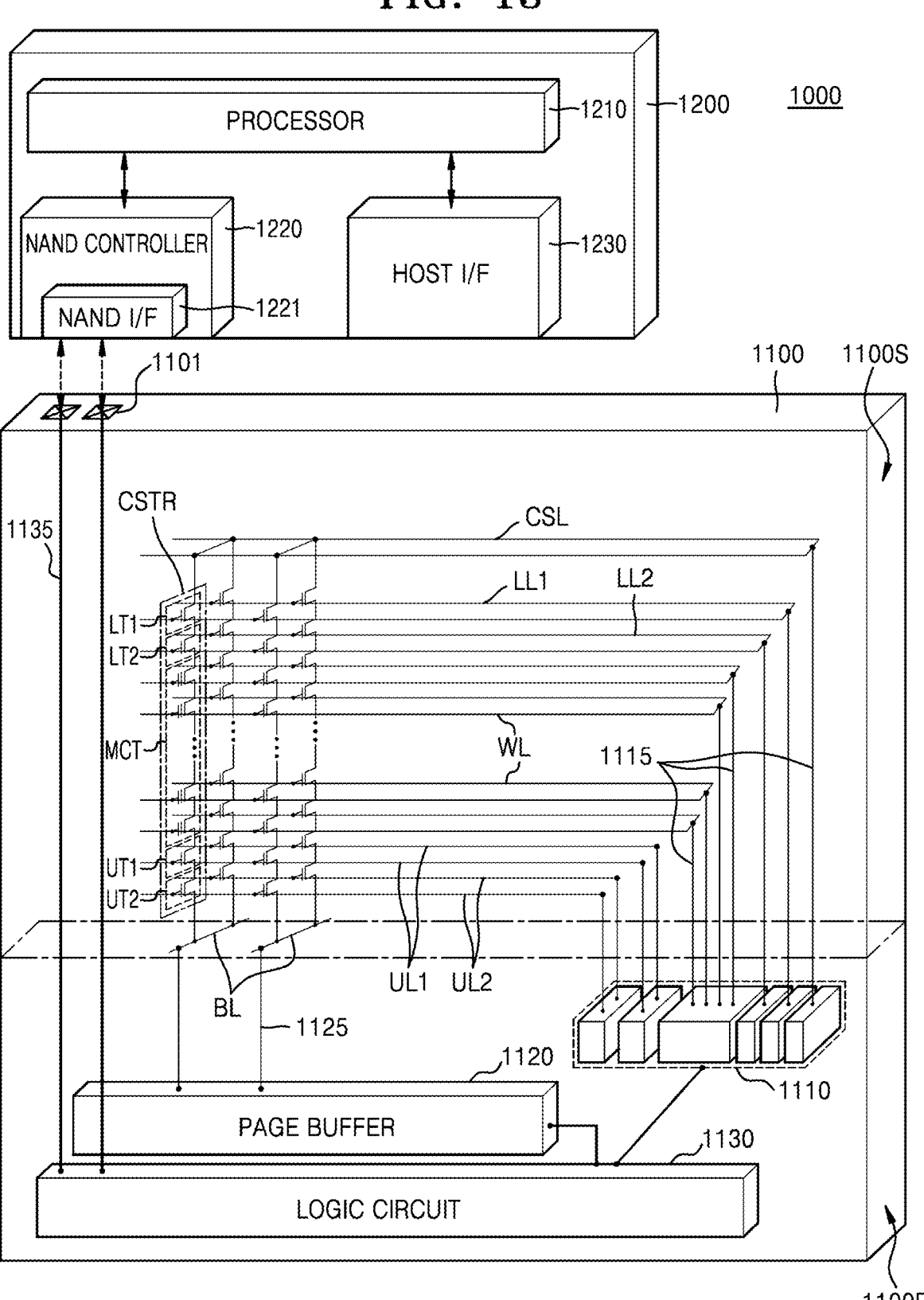
FIG. 13 is a diagram illustrating an electronic system according to example embodiments.

FIG. 13 is a diagram illustrating an electronic system 1000 according to some example embodiments.

Referring to FIG. 13, the electronic system 1000 according to some example embodiments may include a semiconductor chip 1100 and a controller 1200 electrically connected to the semiconductor chip 1100.

The electronic system 1000 may be a storage device including the semiconductor chip 1100 or an electronic device including the storage device. For example, the electronic system 1000 may be a solid state drive device (SSD), a universal serial bus (USB), a computing system, a medical device, or a communication device including at least one semiconductor chip 1100.

The semiconductor chip 1100 may be a non-volatile vertical memory device. The semiconductor chip 1100 may be a NAND flash memory device. For example, the semiconductor chip 1100 may correspond to at least one of the first semiconductor chip 100 and the second semiconductor chip 200 of the chip stack structure 10 of FIG. 1 described above with reference to FIG. 1. The semiconductor chip 1100 may include a first structure 1100F and a second structure 1100S on the first structure 1100F. In some example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, the memory cell strings CSTR may include lower transistors LT1 and LT2 adjacent to the common source line CSL, upper transistors UT1 and UT2 adjacent to the bit line BL, and a plurality of memory cell transistors MCT located between the lower transistors LT1 and LT2 and the upper transistors UT1 and UT2. The number of lower transistors LT1 and LT2 and the number of upper transistors UT1 and UT2 may be variously modified according to some example embodiments.

In some example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2.

The common source line CSL, the gate lower lines LL1 and LL2, the word lines WL, and the gate upper lines UL1 and UL2 may be electrically connected to the decoder circuit 1110 through a plurality of first connection wirings 1115 extending from the first structure 1100F to the second structure 1100S. The bit lines BL may be electrically connected to the page buffer 1120 through a plurality of second connection wirings 1125 extending from the first structure 1100F to the second structure 1100S.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The semiconductor chip 1100 may communicate with the controller 1200 through the I/O pad 1101 electrically connected to the logic circuit 1130. The I/O pad 1101 may be electrically connected to the logic circuit 1130 through an I/O connection wiring 1135 extending from the first structure 1100F to the second structure 1100S.

The controller 1200 may include a processor 1210, a NAND controller 1220, and a host interface 1230. In some example embodiments, the electronic system 1000 may include a plurality of semiconductor chips 1100, and in this case, the controller 1200 may control the semiconductor chips 1100.

The processor 1210 may control an overall operation of the electronic system 1000 including the controller 1200. The processor 1210 may operate according to a certain firmware, and may access the semiconductor chip 1100 by controlling the NAND controller 1220. The NAND controller 1220 may include a NAND interface 1221 that handles communication with the semiconductor chip 1100. Through the NAND interface 1221, a control command for controlling the semiconductor chip 1100, data to be written to the memory cell transistors MCT of the semiconductor chip 1100, and data to be read from a plurality of memory cell transistors MCT of the semiconductor chip 1100 may be transmitted. The host I/F 1230 may provide a communication function between the electronic system 1000 and an external host. When a control command is received from an external host through the host I/F 1230, the processor 1210 may control the semiconductor chip 1100 in response to the control command.

Figure 14:
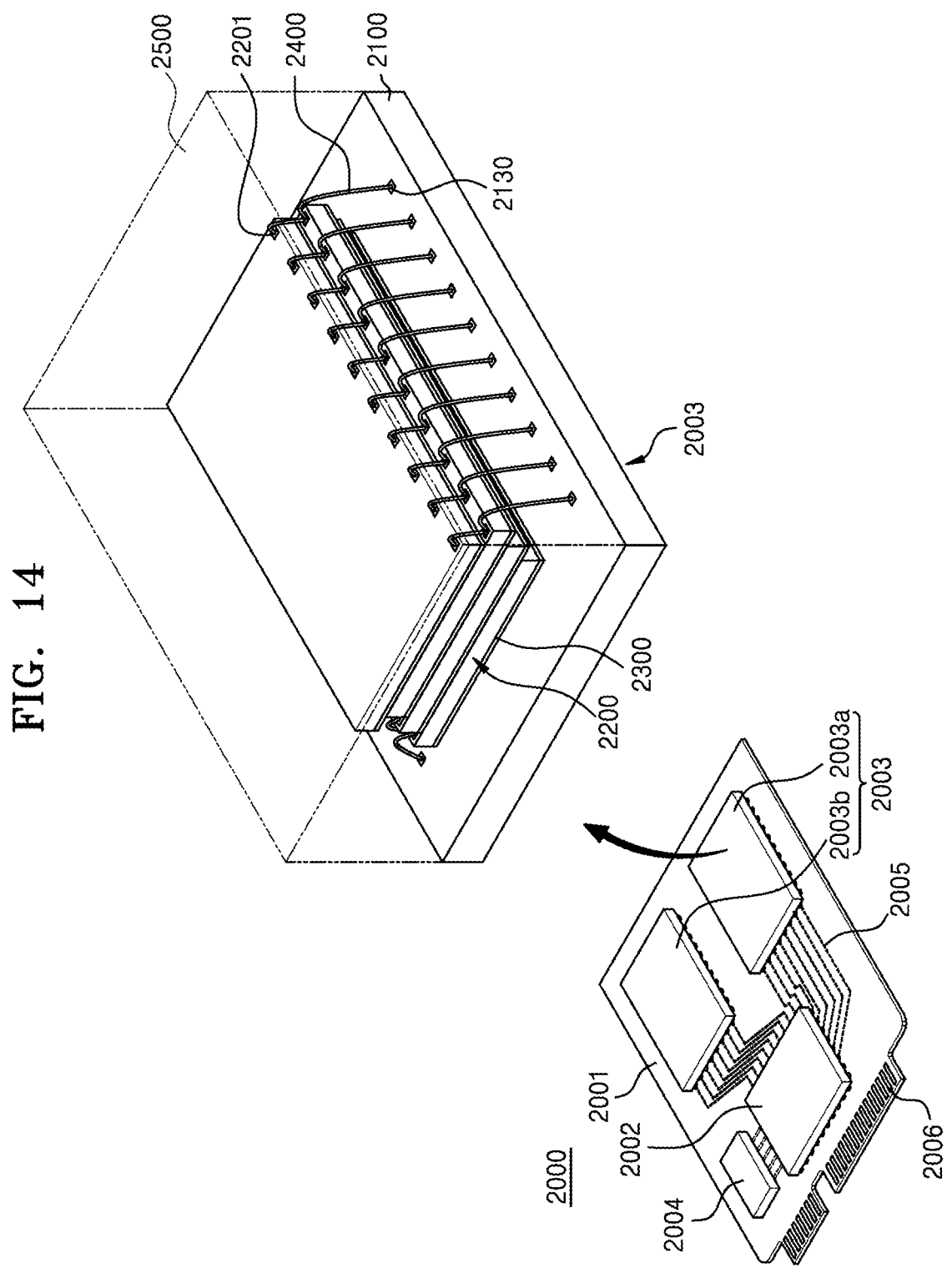
FIG. 14 is a perspective view illustrating an electronic system according to example embodiments.

FIG. 14 is a perspective view of an electronic system 2000 according to some example embodiments.

Referring to FIG. 14, some example embodiments of the electronic system 2000 may include a main board 2001, a controller 2002 mounted on the main board 2001, one or more semiconductor packages 2003, and a DRAM 2004. The semiconductor package 2003 and the DRAM 2004 may be connected to the controller 2002 by a plurality of wiring patterns 2005 formed on the main board 2001. Some example embodiments of semiconductor package 2003 may include the semiconductor packages 700 and 700A described above with reference to FIGS. 6 and 7.

Example embodiments of the main board 2001 may include a connector 2006 including a plurality of pins coupled to an external host. The number and arrangement of the pins of the connector 2006 may vary depending on a communication interface between the electronic system 2000 and the external host. In some example embodiments, the electronic system 2000 may communicate with an external host according to any one of interfaces such as a universal serial bus (USB), a peripheral component interconnect express (PCI-Express), a serial advanced technology attachment (SATA), M-Phy for a universal flash storage (UFS), etc. In some example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the electronic system 2000.

The DRAM 2004 may be a buffer memory for mitigating a speed difference between the semiconductor package 2003 as a data storage space and the external host. When the DRAM 2004 is included in the electronic system 2000, the DRAM 2004 may also operate as a kind of cache memory and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

Example embodiments of the semiconductor package 2003 may include first and second semiconductor packages 2003a and 2003b apart from each other. Each of the first and second semiconductor packages 2003a and 2003b may be a semiconductor package including a plurality of chip stack structures 2200. Each of the first and second semiconductor packages 2003a and 2003b may include a package substrate 2100, a plurality of chip stack structures 2200 on the package substrate 2100, an adhesive layer 2300 disposed on a lower surface of each of the chip stack structures 2200, a connection structure 2400 electrically connecting the chip stack structures 2200 to the package substrate 2100, and a molding layer 2500 covering the chip stack structures 2200 and the connection structure 2400 on the package substrate 2100.

Example embodiments of the package substrate 2100 may be a PCB including a plurality of package upper pads 2130. Each of the chip stack structures 2200 may include an I/O pad 2201. Each of the chip stack structures 2200 may include the chip stack structure 10 described above with reference to FIG. 1.

In some example embodiments, the connection structure 2400 may be a bonding wire electrically connecting the I/O pad 2210 to the package upper pad 2130. Accordingly, in the first and second semiconductor packages 2003a and 2003b, the chip stack structures 2200 may be electrically connected to each other by a bonding wire method, and may be electrically connected to the package upper pad 2130 of the package substrate 2100. In some example embodiments, in the first and second semiconductor packages 2003a and 2003b, the chip stack structures 2200 may be electrically connected to each other by a connection structure including a through-silicon via (TSV), instead of the bonding wire type connection structures 2400.

In some example embodiments, the controller 2002 and the chip stack structures 2200 may be included in a single package. In some example embodiments, the controller 2002 and the chip stack structures 2200 may be mounted on a separate interposer substrate different from the main board 2001, and the controller 2002 may be connected to the chip stack structures 2200 by a wiring formed on the interposer substrate.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While the inventive concept has been particularly shown and described with reference to example embodiments thereof, it will be understood that various changes in form and details may be made therein without departing from the spirit and scope of the following claims. No example embodiment is necessarily mutually exclusive with any other example embodiment. For example, some example embodiments may include features described with reference to one or more figures and may also include features described with reference to one or more other figures.

What is claimed is:

1. A chip stack structure comprising:
a first semiconductor chip including,
    a first semiconductor substrate,
    a first semiconductor device layer on the first semiconductor substrate,
    a first pad layer including a plurality of first pads arranged in a row in a first direction on the first semiconductor substrate, the plurality of first pads including 1 to M (M is a natural number) first pads, each first pad of the plurality of first pads is configured to receive a corresponding signal of a plurality of signals, each signal of the plurality of signals being different, the plurality of first pads are arranged in a first order from 1 to M in the first direction based on the corresponding signal of the plurality of signals each first pad is configured to receive,
    a second pad layer including a plurality of second pads arranged in a row in the first direction on the first pad layer, the plurality of second pads including 1 to M second pads, each second pad of the plurality of second pads is configured to receive a respective signal of the plurality of signals, wherein the plurality of second pads are arranged in a second order from 1 to M in the first direction based on a respective, corresponding signal of the plurality of signals each second pad is configured to receive, the second order being reverse to the first order in the first direction, and
    a redistribution layer including a plurality of redistribution patterns located between the first pad layer and the second pad layer, such that the plurality of redistribution patterns to electrically connect a corresponding first pad, among the plurality of first pads, to a corresponding second pad, among the plurality of second pads, such that each corresponding first pad of the plurality of first pads and each corresponding second pad of the plurality of second pads are configured to receive a same signal of the plurality of signals; and
a second semiconductor chip, on the first semiconductor chip, including,
    a third pad layer including a plurality of third pads arranged in a row in the first direction on the second pad layer and configured to receive different signals of the plurality of signals, such that each third pad of the plurality of third pads is bonded to a respective second pad, among the plurality of second pads, and a second semiconductor device layer on the third pad layer.

2. The chip stack structure of claim 1, wherein an N-th pad (N is a natural number less than or equal to M) in the first direction, among the plurality of second pads, is electrically connected to an (M+1−N)-th pad in the first direction, among the plurality of first pads, through the plurality of redistribution patterns.

3. The chip stack structure of claim 2, wherein the N-th pad in the first direction, among the plurality of second pads, and the (M+1−N)-th pad in the first direction, among the plurality of first pads, are configured to transmit the same signal.

4. The chip stack structure of claim 2, wherein each signal of the plurality of signals is a different type of signal.

5. The chip stack structure of claim 1, wherein, the plurality of first pads and the plurality of second pads are located at a first distance from a first sidewall of the first semiconductor chip in a second direction perpendicular to the first direction, and the plurality of third pads are located at the first distance in the second direction from a second sidewall of the second semiconductor chip aligned with the first sidewall of the first semiconductor chip.

6. The chip stack structure of claim 1, further comprising:
an external connection pad disposed on the second semiconductor device layer of the second semiconductor chip; and
a passivation layer disposed on the second semiconductor device layer of the second semiconductor chip and having an opening exposing the external connection pad.

7. The chip stack structure of claim 1, wherein, the second pad layer further includes a second pad insulating layer surrounding the plurality of second pads, the third pad layer further includes a third pad insulating layer surrounding the plurality of third pads, and the second pad insulating layer is bonded to the third pad insulating layer.

8. The chip stack structure of claim 7, wherein the second pad insulating layer and the third pad insulating layer include silicon oxide.

9. The chip stack structure of claim 1, wherein the first semiconductor chip and the second semiconductor chip include a NAND flash memory chip.

10. The chip stack structure of claim 9, wherein, the first semiconductor device layer of the first semiconductor chip includes,
    a first peripheral circuit structure disposed on the first semiconductor substrate and having a first peripheral circuit, and
    a first cell array structure disposed on the first peripheral circuit structure and having a first memory cell array; and
the second semiconductor device layer of the second semiconductor chip includes,
    a second cell array structure disposed on the third pad layer and having a second memory cell array, and
    a second peripheral circuit structure disposed on the second cell array structure and having a second peripheral circuit.

11. A semiconductor package comprising:
a package substrate; and
a plurality of chip stack structures stacked in a vertical direction on the package substrate, wherein each chip stack structure of the plurality of chip stack structures includes a first semiconductor chip and a second semiconductor chip on the first semiconductor chip;

wherein the first semiconductor chip includes, a first semiconductor substrate, a first semiconductor device layer on the first semiconductor substrate, a first pad layer including a plurality of first pads arranged in a row in a first direction on the first semiconductor substrate, the plurality of first pads including 1 to M (M is a natural number) first pads, each first pad of the plurality of first pads is configured to receive a corresponding signal of a plurality of signals, each signal of the plurality of signals being different, the plurality of first pads are arranged in a first order from 1 to M in the first direction based on the corresponding signal of the plurality of signals each first pad is configured to receive, a second pad layer including a plurality of second pads arranged in a row in the first direction on the first pad layer, the plurality of second pads including 1 to M second pads, each second pad of the plurality of second pads is configured to receive a respective signal of the plurality of signals, the plurality of second pads are arranged in a second order from 1 to M in the first direction based on a respective, corresponding signal of the plurality of signals each second pad is configured to receive being reverse to the first order in the first direction, and a redistribution layer including a plurality of redistribution patterns located between the first pad layer and the second pad layer, such that the plurality of redistribution patterns electrically connect a corresponding first pad, among the plurality of first pads, to a corresponding second pad, among the plurality of second pads, such that each corresponding first pad of the plurality of first pads and each corresponding second pad of the plurality of second pads are configured to transmit a same signal of the plurality of signals; and wherein the second semiconductor chip includes, a third pad layer including a plurality of third pads arranged in a row in the first direction on the second pad layer and configured to receive different signals of the plurality of signals, such that each third pad of the plurality of third pads is bonded to a respective second pad, among the plurality of second pads, and a second semiconductor device layer on the third pad layer.

12. The semiconductor package of claim 11, wherein, in two adjacent chip stack structures, among the plurality of chip stack structures, an upper chip stack structure protrudes laterally from a lower chip stack structure, and each of the plurality of chip stack structures is configured to electrically connected to the package substrate through a conductive wire.

13. The semiconductor package of claim 12, wherein, each of the plurality of chip stack structures further includes, an external connection pad disposed on the second semiconductor device layer of the second semiconductor chip, and a passivation layer disposed on the second semiconductor device layer of the second semiconductor chip and having an opening exposing the external connection pad; and the conductive wire is connected to the external connection pad.

14. The semiconductor package of claim 11, further comprising:

an adhesive material layer located between two adjacent chip stack structures, among the plurality of chip stack structures.

15. The semiconductor package of claim 11, further comprising:

a connection bump located between two adjacent chip stack structures, among the plurality of chip stack structures.

16. The semiconductor package of claim 11, wherein, an N-th pad (N is a natural number less than or equal to M) in the first direction, among the plurality of second pads, is electrically connected to an (M+1−N)-th pad in the first direction, among the plurality of first pads, through the plurality of redistribution patterns, and the N-th pad in the first direction, among the plurality of second pads, is bonded to an N-th pad in the first direction, among the plurality of third pads.

17. The semiconductor package of claim 11, wherein, in each of the plurality of chip stack structures, the first semiconductor chip is bonded to the second semiconductor chip through hybrid bonding, and the first semiconductor chip and the second semiconductor chip include a NAND flash memory chip.

18. A chip stack structure comprising:

a first semiconductor chip including, a first semiconductor substrate, a first semiconductor device layer on the first semiconductor substrate, a first pad layer including a plurality of first pads arranged in a row in a first direction on the first semiconductor substrate, the plurality of first pads including 1 to M (M is a natural number) first pads, each first pad of the plurality of first pads is configured to receive a corresponding signal of a plurality of signals, each signal of the plurality of signals being different, the plurality of first pads are arranged in a first order from 1 to M in the first direction based on the corresponding signal of the plurality of signals each first pad is configured to receive and a first pad insulating layer surrounding the plurality of first pads, a second pad layer including a plurality of second pads arranged in a row in the first direction on the first pad layer, the plurality of second pads including 1 to M second pads, each second pad of the plurality of second pads is configured to receive a respective signal of the plurality of signals, the plurality of second pads are arranged in a second order from 1 to M in the first direction based on a respective, corresponding signal of the plurality of signals each second pad is configured to receive being reverse to the first order in the first direction and a second pad insulating layer surrounding the plurality of second pads, and a redistribution layer including a plurality of redistribution patterns located between the first pad layer and the second pad layer, wherein the plurality of redistribution patterns electrically connect a corresponding first pad, among the plurality of first pads, to a corresponding second pad, among the plurality of second pads, such that each corresponding first pad of the plurality of first pads and each corresponding second pad of the plurality of second pads are configured to transmit a same signal of the plurality of signals;

a second semiconductor chip, on the first semiconductor chip including, a third pad layer including a plurality of third pads arranged in a row in the first direction on the second pad layer and configured to receive different signals of the plurality of signals, and a third pad insulating layer surrounding the plurality of third pads, such that each third pad of the plurality of third pads is bonded to a respective second pad, among the plurality of second pads, a second semiconductor device layer on the third pad layer, and external connection pads on the second semiconductor chip; and a passivation layer disposed on the second semiconductor chip and having openings exposing the external connection pads, wherein, an N-th pad (N is a natural number less than or equal to M) in the first direction, among the plurality of second pads, is configured to electrically connect to an (M+1−N)-th pad in the first direction, among the plurality of first pads, through the plurality of redistribution patterns, and the N-th pad in the first direction, among the plurality of second pads, is bonded to an N-th pad in the first direction, among the plurality of third pads.

19. The chip stack structure of claim 18, wherein, the second pad insulating layer is bonded to the third pad insulating layer, and the second pad insulating layer and the third pad insulating layer include silicon oxide.

20. The chip stack structure of claim 18, wherein, the first semiconductor device layer of the first semiconductor chip includes, a first peripheral circuit structure disposed on the first semiconductor substrate and having a first peripheral circuit, and a first cell array structure disposed on the first peripheral circuit structure and having a first memory cell array; and the second semiconductor device layer of the second semiconductor chip includes, a second cell array structure disposed on the third pad layer and having a second memory cell array, and a second peripheral circuit structure disposed on the second cell array structure and having a second peripheral circuit.

* * * * *